(12) United States Patent
Sajiki

(10) Patent No.: US 10,396,257 B2
(45) Date of Patent: *Aug. 27, 2019

(54) METHOD OF MANUFACTURING LIGHT EMITTING DEVICE

(71) Applicant: NICHIA CORPORATION, Anan-shi (JP)

(72) Inventor: Shigeki Sajiki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,686

(22) Filed: Dec. 21, 2017

(65) Prior Publication Data

US 2018/0182936 A1  Jun. 28, 2018

(30) Foreign Application Priority Data

Dec. 22, 2016 (JP) ................................. 2016-249004

(51) Int. Cl.
```
H01L 33/54      (2010.01)
H01L 33/60      (2010.01)
H01L 33/48      (2010.01)
H01L 33/50      (2010.01)
```
(Continued)

(52) U.S. Cl.
CPC ............ *H01L 33/54* (2013.01); *H01L 33/486* (2013.01); *H01L 33/505* (2013.01); *H01L 33/52* (2013.01); *H01L 33/60* (2013.01); *H01L 33/62* (2013.01); *H01L 2933/005* (2013.01); *H01L 2933/0033* (2013.01); *H01L 2933/0041* (2013.01)

(58) Field of Classification Search
CPC ...... H01L 33/62; H01L 25/0753; H01L 33/50; H01L 2224/13; H01L 2924/0002; H01L 2933/0041
See application file for complete search history.

(56) References Cited

U.S. PATENT DOCUMENTS

2012/0261699 A1* 10/2012 Ooyabu ................ H01L 33/505
                                                      257/98
2014/0138725 A1  5/2014 Oyamada
2016/0133809 A1  5/2016 Kuramoto

FOREIGN PATENT DOCUMENTS

JP  2010-219324  9/2010
JP  2012-222315  11/2012
JP  2012-227470  11/2012
(Continued)

*Primary Examiner* — Mohammed R Alam
(74) *Attorney, Agent, or Firm* — Mori & Ward, LLP

(57) ABSTRACT

A method of manufacturing a light emitting device include providing a mold with a mold recess having a bottom and an inner peripheral surface that is connected to the bottom. The bottom includes a bottom projection and a bottom recess surrounding the bottom projection to define the bottom projection that has a projection top surface and a projection peripheral surface opposing the inner peripheral surface. A light emitting element is mounted on the bottom projection such that a light extraction surface of the light emitting element faces the projection top surface and such that an outer peripheral surface of the light emitting element opposes the inner peripheral surface of the mold recess. A covering material is provided in the mold recess to cover the inner peripheral surface of the mold recess, the outer peripheral surface of the light emitting element, and the projection peripheral surface.

18 Claims, 18 Drawing Sheets

(51) Int. Cl.
*H01L 33/52* (2010.01)
*H01L 33/62* (2010.01)

(56) References Cited

FOREIGN PATENT DOCUMENTS

| | | |
|---|---|---|
| JP | 2013-012545 | 1/2013 |
| JP | 2014-112669 | 6/2014 |
| JP | 2015-012143 | 1/2015 |
| JP | 2016-027668 | 2/2016 |
| JP | 2016-092276 | 5/2016 |

* cited by examiner

US 10,396,257 B2

METHOD OF MANUFACTURING LIGHT EMITTING DEVICE

CROSS-REFERENCE TO RELATED APPLICATIONS

The present application claims priority under 35 U.S.C. § 119 to Japanese Patent Application No. 2016-249004, filed Dec. 22, 2016. The contents of this application are incorporated herein by reference in their entirety.

BACKGROUND

Field of the Invention

The present disclosure relates to a method of manufacturing a light emitting device.

Discussion of the Background

Light emitting devices are known in each of which a reflective member covers lateral surface of a light emitting element instead of disposing a housing for housing the light emitting element (e.g., JP 2010-219324 A, JP 2012-227470 A, JP 2013-012545 A, JP 2014-112669 A).

SUMMARY

According to one aspect of the present disclosure, a method of manufacturing a light emitting device include providing a mold with a mold recess having a bottom and an inner peripheral surface that defines the mold recess and that is connected to the bottom. The bottom includes a bottom projection and a bottom recess surrounding the bottom projection to define the bottom projection that has a projection top surface and a projection peripheral surface opposing the inner peripheral surface. The projection top surface defines a part of the bottom. A light emitting element is mounted on the bottom projection in the mold recess such that a light extraction surface of the light emitting element faces the projection top surface and such that an outer peripheral surface of the light emitting element opposes the inner peripheral surface of the mold recess. A covering material is provided in the mold recess to cover the inner peripheral surface of the mold recess, the outer peripheral surface of the light emitting element, and the projection peripheral surface. The mold is removed to provide a recess in the covering material. A light-transmissive material is provided in the recess in the covering material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1A:
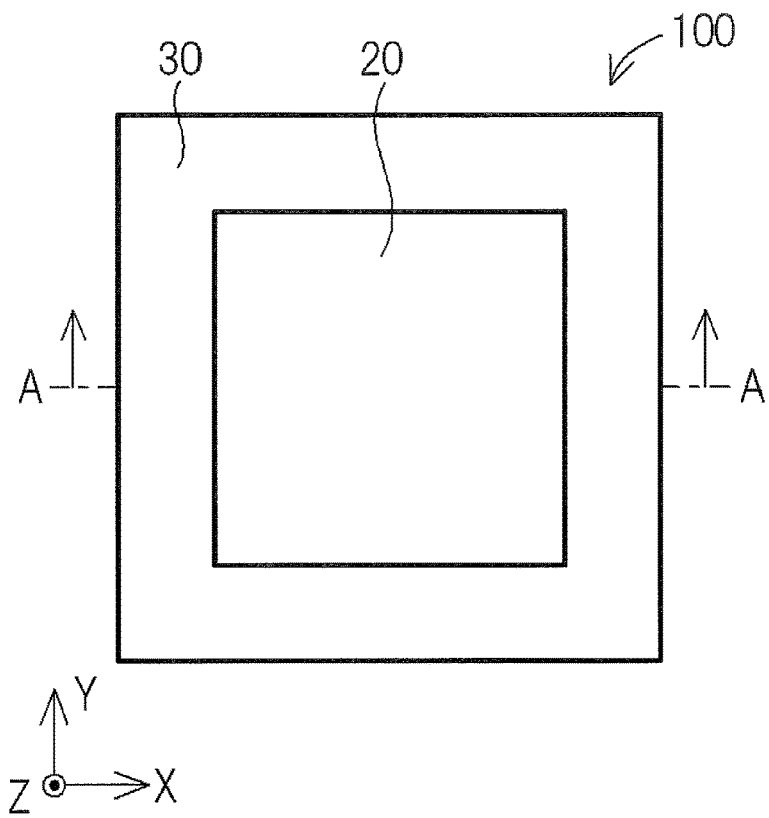
FIG. 1A is a schematic top view of a light emitting device according to a first embodiment.

The embodiments will now be described with reference to the accompanying drawings, wherein like reference numerals designate corresponding or identical elements throughout the various drawings.

With reference to the drawings, certain embodiments of the present disclosure will be described below in detail. Note that, in the description below, the terms that indicate specific directions or positions are used as necessary (for example, "top", "upper", "bottom", "lower", and other terms including these terms). These terms are used for facilitating understanding of the disclosure with reference to the drawings, and the meaning of the terms do not limit the technical scope of the present disclosure. Further, portions or members denoted by an identical reference numeral and appearing in a plurality of drawings are an identical part or member. Further, each of resin members such as a first covering member, a first light-transmissive member, and a second light-transmissive member is referred to by an identical name in both the liquid state before being cured or hardened, and the solid state after being cured or hardened.

First Embodiment

Figure 1B:
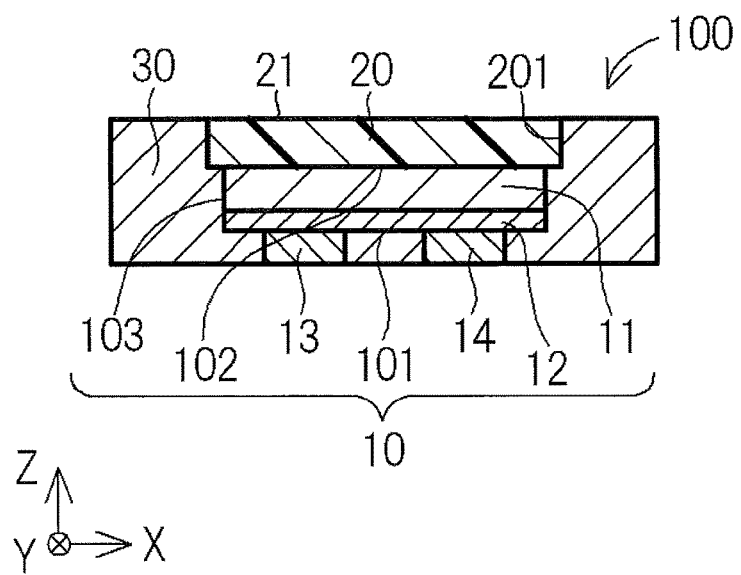
FIG. 1B is a schematic cross-sectional view taken along line A-A in FIG. 1A.

FIGS. 1A and 1B show a light emitting device 100 according to a first embodiment. The light emitting device 100 includes a light emitting element 10, a first light-transmissive member (a light-transmissive material) 20 on an upper surface of the light emitting element 10, and a first covering member (a covering material) 30 that covers lateral surfaces of the first light-transmissive member 20. An upper surface of the first light-transmissive member 20 serves as a light emitting surface (i.e., light extraction surface) 21 of the light emitting device 100. The light emitting element 10 includes a first surface 101 on which a plurality of electrodes 13, 14, a second surface 102 opposite to the first surface 101, and lateral surfaces 103 between the first surface and the second surface.

Figure 1C:
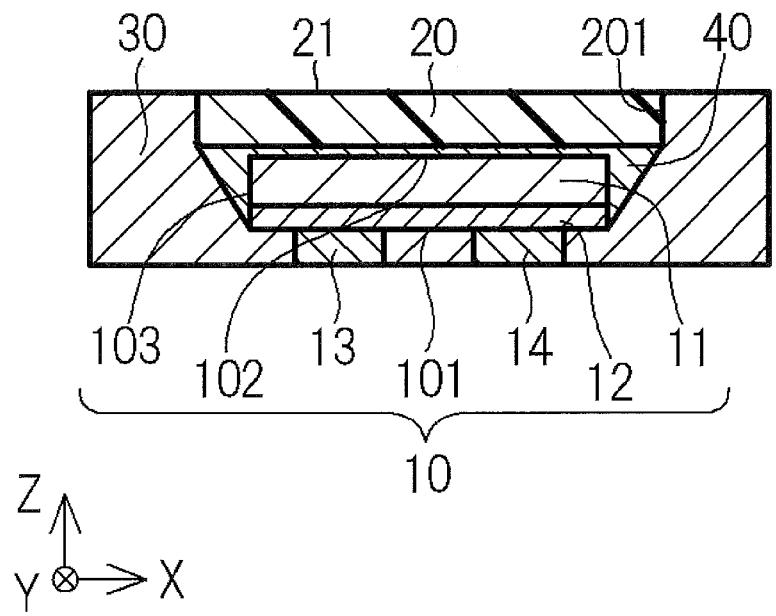
FIG. 1C is a schematic cross-sectional view of a variant example of the light emitting device according to the first embodiment.

As shown in FIG. 1C, the light emitting device may include a second light-transmissive member (an additional light-transmissive material) 40 that covers the lateral surfaces 103 and/or the second surface 102 of the light emitting element.

With reference to FIGS. 2 to 8, a description will be given of a method of manufacturing the light emitting device according to the first embodiment.

Step 1-1. Providing Light Emitting Element

Figure 2:
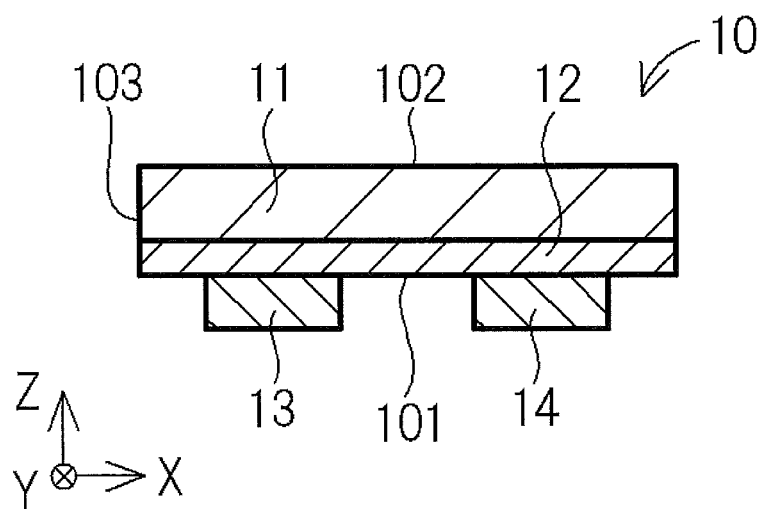
FIG. 2 is a schematic cross-sectional view showing a step of providing the light emitting device according to the first embodiment.

As shown in FIG. 2, for the light emitting element 10, for example, a semiconductor light emitting element such as a light emitting diode is provided. The light emission wavelength of the light emitting element can be selected from the ultraviolet-light range to the infrared-light range, including the visible-light range (380 nm to 780 nm). The light emitting element 10 includes a light-transmissive substrate 11, a semiconductor layered body 12, and a plurality of electrodes 13, 14.

Further, the light emitting element 10 includes the first surface 101 having the plurality of electrodes 13, 14, the second surface 102 opposite to the first surface 101, and the lateral surfaces 103 between the first surface 101 and the second surface 102. Each of the plurality of electrodes 13, 14 may have any appropriate shape. In the light emitting device according to the present embodiment, the first surface 101 is a lower surface of the semiconductor layered body 12, and the second surface 102 is the upper surface of the light-transmissive substrate 11.

Step 1-2. Providing Mold

Figure 3A:
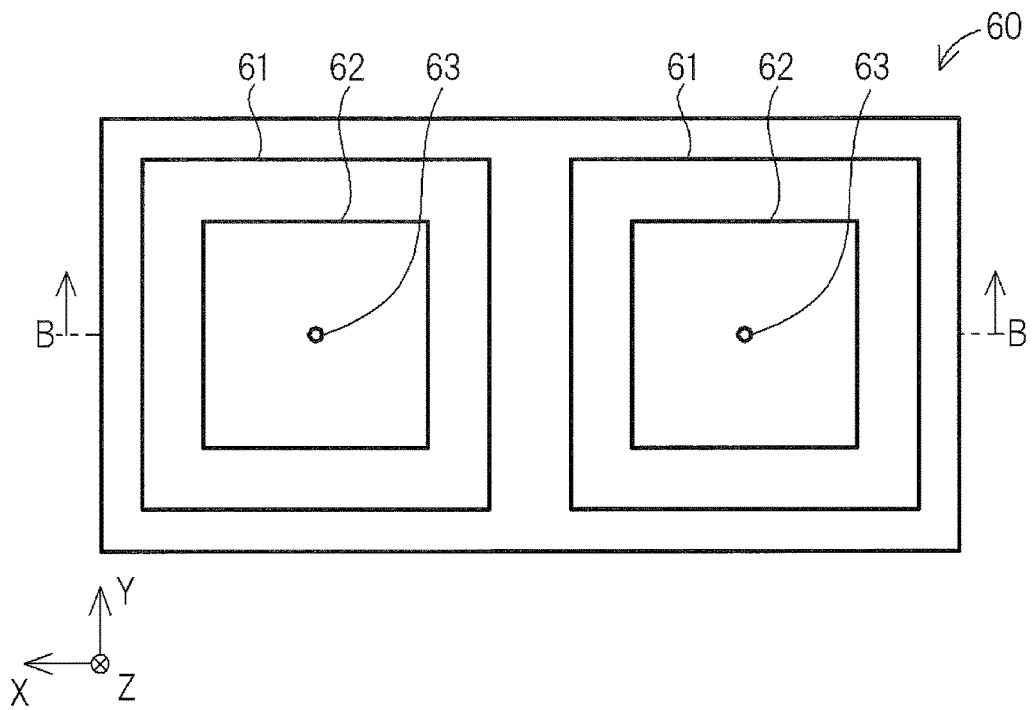
FIG. 3A is a schematic top view showing a step of providing a mold according to the first embodiment.
Figure 3B:
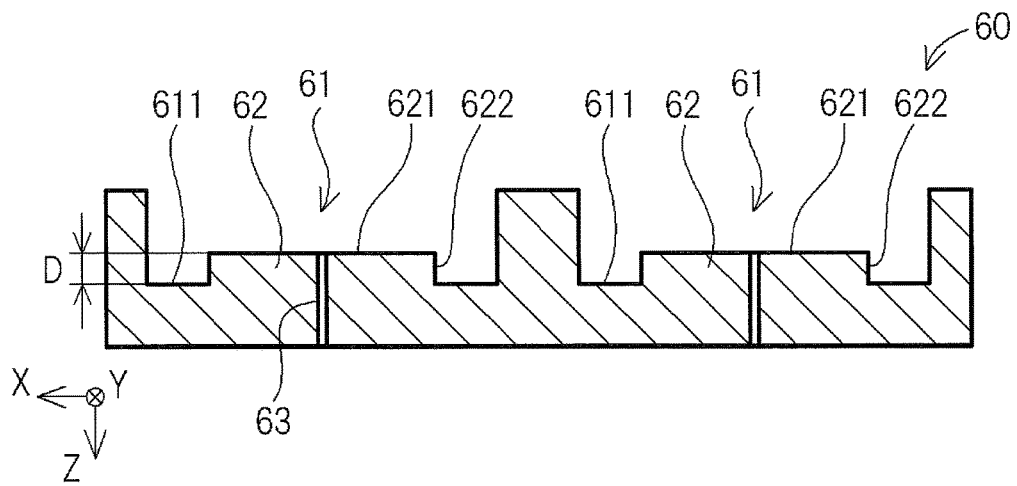
FIG. 3B is a schematic end view taken along line B-B in FIG. 3A.

As shown in FIGS. 3A and 3B, a mold 60 is provided. One or more first recesses 61 are defined in an upper surface of the mold 60, and projections 62 are respectively formed at a bottom surface 611 of respective one of the first recesses 61. A plurality of first recesses 61 is preferably defined in the upper surface. This structure allows for simultaneously manufacturing a plurality of light emitting devices. The projections 62 each have an upper surface 621 for mounting the light emitting element 10. The upper surface 621 of the projection preferably has a flat surface. This structure allows the light emitting element 10 to be easily mounted on the upper surface of respective one of the projections 62. Each of the projections 62 of the mold corresponds to a respective one of second recesses 90, which will be formed by removing the mold in a later step as will be described below. Each of the second recesses 90 will be defined by lateral walls, which are a portion of each of the first covering members 30. The mold 60 defines a through hole 63 for vacuum suction in the upper surface 621 of each of the projections 62. This structure allows for fixing the light emitting element 10 mounted on the upper surface 621 of each of the projections 62 in a step of mounting the light emitting element which will be described later.

For example, in the case where a single light emitting element 10 is placed on a respective one of the projections 62, the upper surface 621 of each of the projections 62 preferably has an area of at least 50% to 200%, further preferably 100% to 120% as large as an area of the second surface of the light emitting element.

The upper surface 621 of each of the projections 62 of the mold 60 may have a circular shape, an elliptical shape, a polygonal shape (for example, quadrangular shape or hexagonal shape), or a combination of two or more of these. The shape of the upper surface 621 of each of the projections 62 of the mold 60 is substantially the same with the shape of a lower surface of a first light-transmissive member which will be described below. Further, lateral surfaces 622 of each of the projections 62 may be perpendicular or inclined with respect to the upper surface 621 of respective one of the projections 62. That is, with the lateral surface 622 of each of the projections 62 perpendicular to the upper surface 621, each of the projections 62 may have a columnar shape such as a circular shape, a cylindrical shape, or a prismatic shape (for example, a quadrangular prism, or a hexagonal prism). Further, with the lateral surfaces 622 of each of the projections 62 which are inclined surfaces, each of the projections 62 may have a frustum shape such as a truncated cone, a truncated pyramid or the like. In the case where the lateral surfaces 622 of each projection are inclined, the inclination angle may be in a range of about 30 degrees to 90 degrees with respect to the upper surface 621 (i.e., the horizontal surface). Further, each of the projections 62 preferably has a height of, for example, in a range of approximately 0.1 mm to 0.5 mm, and further preferably in a range of approximately 0.15 mm to 0.25 mm. The "height of the projection 62" refers to a distance D between the bottom surface 611 of each of the first recesses 61 to the upper surface 621 of respective one of the projections 62 in the Z direction.

All of the plurality of first recesses 61 defined in one mold preferably has the same shape. Further, the first recesses 61 are preferably defined such that the intervals between adjacent ones of the first recesses 61 are constant. It is more preferable that the first recesses 61 are regularly arranged in a longitudinal direction and a lateral direction (i.e., arranged in a matrix). Further, all of the projections 62 at all of the plurality of first recesses also preferably have the same shape. With this shape, a plurality of light emitting devices having the same shape can be manufactured.

In a top view, each of the first recesses 61 of the mold may have a circular shape, an elliptical shape, or a polygonal shape (for example, quadrangular shape, or a hexagonal shape), or a combination of two or more of these. Further, inner lateral surfaces 612 of each of the first recesses 61 may be perpendicular to or inclined with respect to the bottom surface 611 of the first recess. The inner lateral surfaces 612 of each of the first recesses 61 is preferably inclined with respect to the bottom surface 611 of respective one of the first recesses at about 87 degrees to 89.9 degrees. This structure allows the mold to be easily removed in a later step which will be described below.

In forming of the first covering member, which will be described below, the mold 60 (i.e., a lower mold) that defines the plurality of first recesses 61 in the upper surface thereof and having the projections 62 respectively at the bottom surface 611 of respective one of the first recesses 61, as described above, may be used.

Alternatively, an upper mold may further be used. In the case of using only the mold 61 (i.e., the lower mold), the forming of the first covering member, which will be described below, may be performed by using a potting technique, a printing technique, a spraying technique, or the like. In the case where the mold 61 (i.e., the lower mold) and the upper mold are used in combination, the forming of the first covering member, which will be described below, may be performed by a transfer molding technique, a compression molding technique, an injection molding technique, or the like. In the case where the upper mold is used, a lower surface of the upper mold and the upper surface of the mold 61 (i.e., the lower mold) are disposed so as to face each other. The lower surface of the upper mold may be a flat surface, or may have small irregularities. Further, the lower surface of the upper mold and the upper surfaces of the projections of the mold (the lower mold) are disposed with a space between each other that allows the first covering member before being cured to be poured therein. That is, the lower surface of the upper mold and the upper surfaces of the projections of the mold 61 (i.e., the lower mold) are preferably spaced apart from each other.

Step 1-3. Mounting Light Emitting Element

Figure 4A:
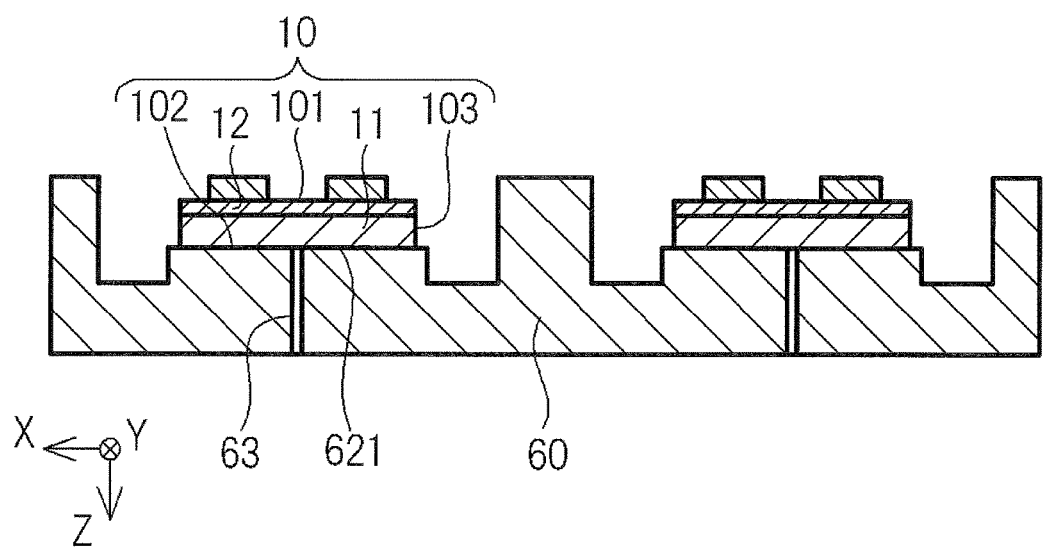
FIG. 4A is a schematic end view showing a step of mounting the light emitting element according to the first embodiment.

As shown in FIG. 4A, each of the light emitting elements 10 is mounted on the upper surface 621 of respective one of the projections 62 of the mold 60 such that the upper surface 621 of the respective one of the projections 62 faces the second surface 102 of the light emitting element 10. Then, the light emitting elements 10 are fixed. For fixing the light emitting elements 10, vacuum suction may be used. In the case of performing vacuum suction, through hole 63 for vacuum suction is defined in the upper surface 621 of each of the projections 62 of the mold 60, and the light emitting elements 10 mounted on the upper surfaces 621 are suctioned, so that the light emitting elements 10 can be fixed. In this case, the opening of each of the through holes preferably has a diameter smaller than an area of the second surface of respective one of the light emitting elements 10.

Figure 4B:
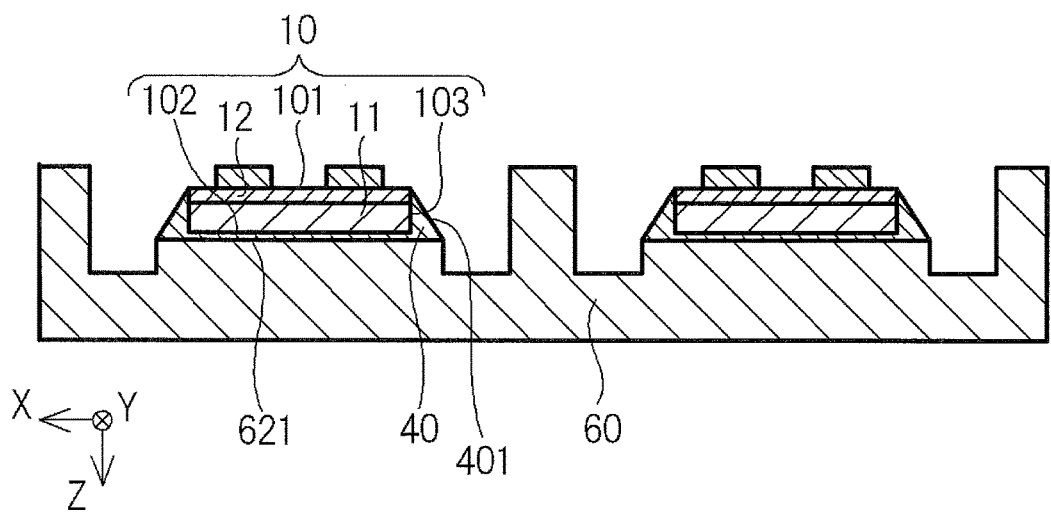
FIG. 4B is a schematic end view showing a variant example of the step of mounting the light emitting element according to the first embodiment.

Alternatively, as shown in FIG. 4B, for fixing the light emitting elements 10, the second light-transmissive members 40 may be used. After each of the second light-transmissive members 40 in the liquid state before being cured is disposed between the upper surface 621 of respective one of the projections 62 and the second surface 102 of respective one of the light emitting elements 10, the second light-transmissive members 40 are cured. Accordingly, each of the light emitting elements can be fixed by respective one of the second light-transmissive members 40 disposed between the upper surface 621 of respective one of the projections 62 and the second surface 102 of respective light emitting element 10. Each of the second light-transmissive members 40 in the liquid state before being cured may be disposed on the upper surface 621 of respective one of the projections 62, or may be disposed on the second surface 102 of respective one of the light emitting elements 10.

Each of the second light-transmissive members 40 may continuously cover the second surface 102 of and the lateral surfaces 103 of the respective one of the light emitting elements 10. The second light-transmissive members 40 respectively covering the lateral surfaces 103 of respective one of the light emitting elements 10 to be in contact with each other allows for improving adhesion between each of the light emitting elements 10 and respective one of the projections 62, and thus is preferable. Improvement in adhesion between each of the light emitting elements 10 and respective one of the projections 62 can reduce shifting of each of the light emitting elements 10 from the upper surface of respective one of the projections during forming of the first covering member, which will be described below. The second light-transmissive members 40 have a transmittance of light from the light emitting element greater than that of the first covering members, which will be described below. Accordingly, each of the second light-transmissive members 40 preferably continuously covers the lateral surface of the light-transmissive substrate 11 and the lateral surface of the semiconductor layered body 12. Further, outer surfaces 401 of each of the second light-transmissive members 40 are preferably inclined outward from the first surface 101 of respective one of the light emitting elements 10 toward the second surface 102. With this shape, light from the light emitting element 10 is easily extracted to the outside of the light emitting element 10 through the respective second light-transmissive member 40.

After each of the light emitting element 10 is mounted on the upper surface of respective one of the projections 62, each of the second light-transmissive members 40 that covers the lateral surfaces of respective ones of the light emitting elements 10 may be disposed on the upper surface 621 of respective ones of the projections 62 of the mold. In this case, the upper surface 621 of each of the projections 62 of the mold has an area greater than that of the second surface 102 of respective one of the light emitting elements 10 mounted thereon. That is, the upper surface 621 of each of the projections 62 include a portion not covered by respective one of the light emitting elements 10. For example, after the light emitting elements 10 are mounted on the upper surfaces of the projections 62 of the mold, each of the second light-transmissive members before being cured is disposed on a portion of the upper surface 621 of respective one of the projections 62 exposed from respective one of the light emitting elements 10. The second light-transmissive members 40 before being cured are in the liquid state with flowability. By being disposed on the upper surface of respective one of the projections 62, each of the second light-transmissive members 40 before being cured creeps up the lateral surfaces of respective one of the light emitting elements 10. Thereafter, the second light-transmissive members 40 in the liquid state being cured, so that the second light-transmissive members 40 each covering at least a portion of each of the lateral surfaces of respective one of the light emitting elements 10 can be formed. Each of the second light-transmissive members 40 may be disposed to cover substantially the entirety of the lateral surfaces of respective one of the light emitting elements 10.

It is preferable that the second each of light-transmissive members 40 is not disposed in a region other than on the upper surface 621 of respective one of the projections 62 of the mold, that is, not disposed on the lateral surfaces of the respective one of the projections 62 or the bottom surface 611 of corresponding one of the first recesses 61. With this arrangement, each of the second light-transmissive members 40 can be prevented from reaching the outer surfaces of respective one of the light emitting devices, so that visibility of the light emitting device can be improved. Here, the term "visibility" refers to directivity of light in the emission direction.

Figure 4C:
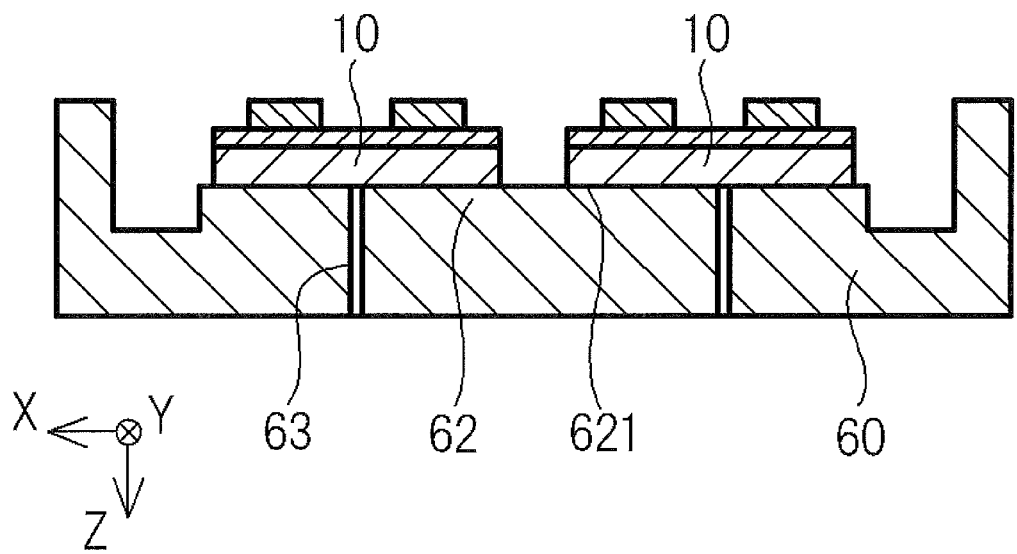
FIG. 4C is a schematic end view showing a variant example of the step of mounting the light emitting element according to the first embodiment.

A single light emitting element 10 may be mounted on the upper surface 621 of each of the projections 62 of the mold. Alternatively, as shown in FIG. 4C, a plurality of light emitting elements 10 may be mounted on each of the projections 62. Mounting a plurality of light emitting elements on each of the projections 62 allows for obtaining light emitting devices each including a plurality of light emitting elements. Thus, compared with an array of a plurality of light emitting devices each including a single light emitting element, a light emitting device being reduced in size while including light emitting elements of the same number as that of the array of a plurality of light emitting devices and having similar output can be obtained.

Figure 4D:
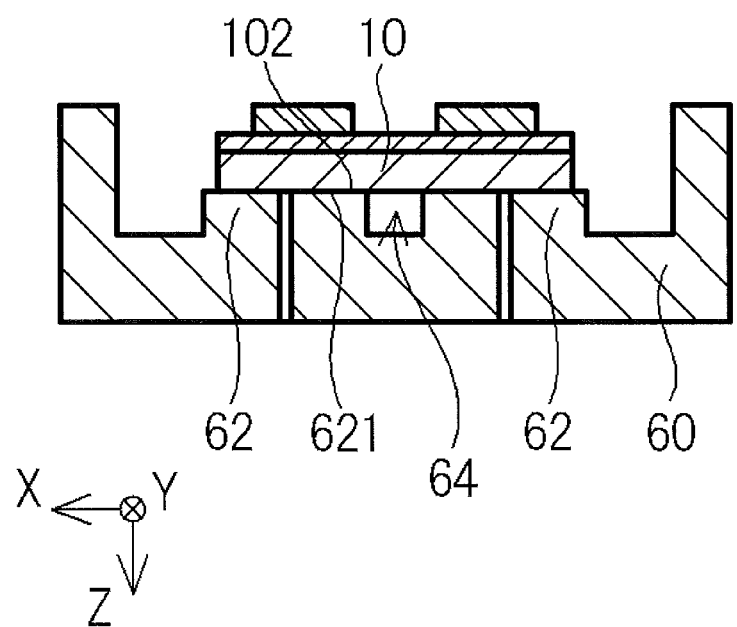
FIG. 4D is a schematic end view showing a variant example of the step of mounting the light emitting element according to the first embodiment.

Further, as shown in FIG. 4D, a single light emitting element may be mounted on a plurality of projections 62. In this manner, a hollow 64 is defined by the second surface 102 of the light emitting element and the mold 60. Forming the first covering member, which will be described later, in the hollow 64 allows for forming a plurality of second recesses 90 each defined by lateral walls, which are a portion of the first covering member. Thus, a plurality of first light-transmissive members 20, which will be described below, can be formed on the upper surface of the light emitting element 10. The plurality of first light-transmissive members may be made of the same material or different materials. For example, with a plurality of first light-transmissive members 20 containing different fluorescent materials at each of the plurality of first light-transmissive members 20 and covering the upper surface of the light emitting element 10, a light emitting device configured to emit light of wavelengths different at each of the first light-transmissive members 20 is obtained.

Step 1-4. Forming First Covering Member

Figure 5A:
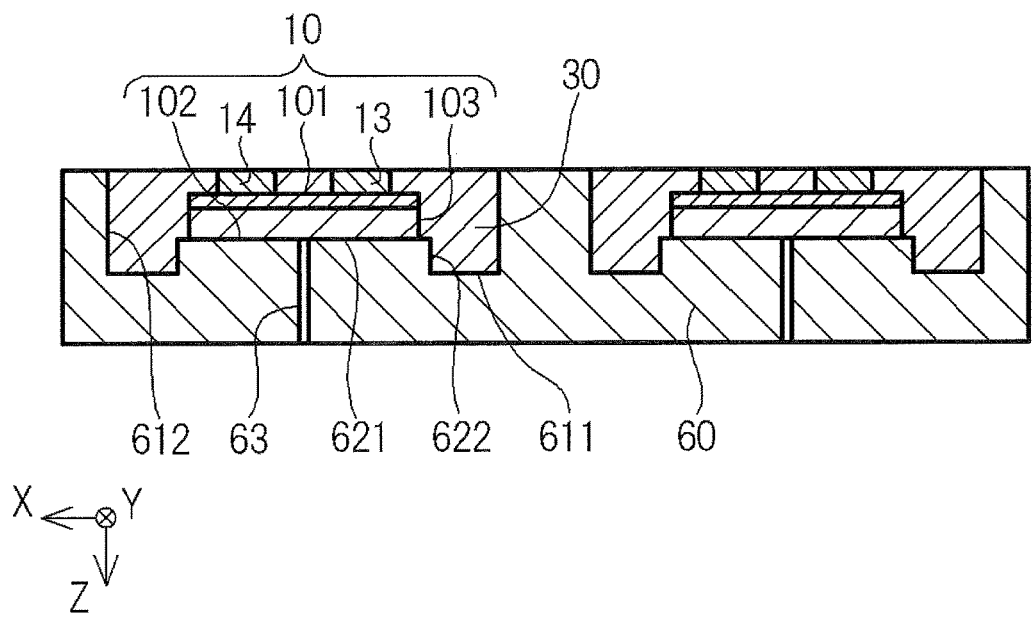
FIG. 5A is a schematic end view showing a step of forming a first covering member according to the first embodiment.

As shown in FIG. 5A, in each of the first recesses 61 of the mold, the first covering member 30 that covers the inner lateral surfaces 612 of respective one of the first recesses 61 of the mold, the lateral surfaces 622 of respective one of the projections 62 of the mold, and the lateral surfaces 103 of respective one of the light emitting elements 10 is formed. Each first covering member 30 has a light-reflectivity. Each of the first covering members 30 may cover the bottom surface 611 of respective one of the first recesses 61 of the mold. Each of the first covering members 30 is preferably disposed to cover the entirety of the lateral surfaces 103 of respective one of the light emitting elements 10. Though each of the first covering members 30 may cover the inner lateral surfaces 612 of respective one of the first recesses 61 of the mold via another member, it is preferable that each of the first covering members 30 and the inner lateral surfaces of respective one of the first recess are in contact with each other. With this arrangement, each of the first covering members 30 can have a shape that is substantially the same with the shape of respective one of the first recesses 61. The shape of each of the first covering members 30 being substantially the same with the shape of respective one of the first recesses 61 allows for reducing variations in the shape of the first covering members 30.

In forming the first covering member 30, for example, a liquid resin material, which is a raw material of the first covering members 30, is poured into the first recesses of the mold. Thereafter, the liquid resin material is cured by heating or the like, so that the first covering member 30 can be formed.

Figure 5B:
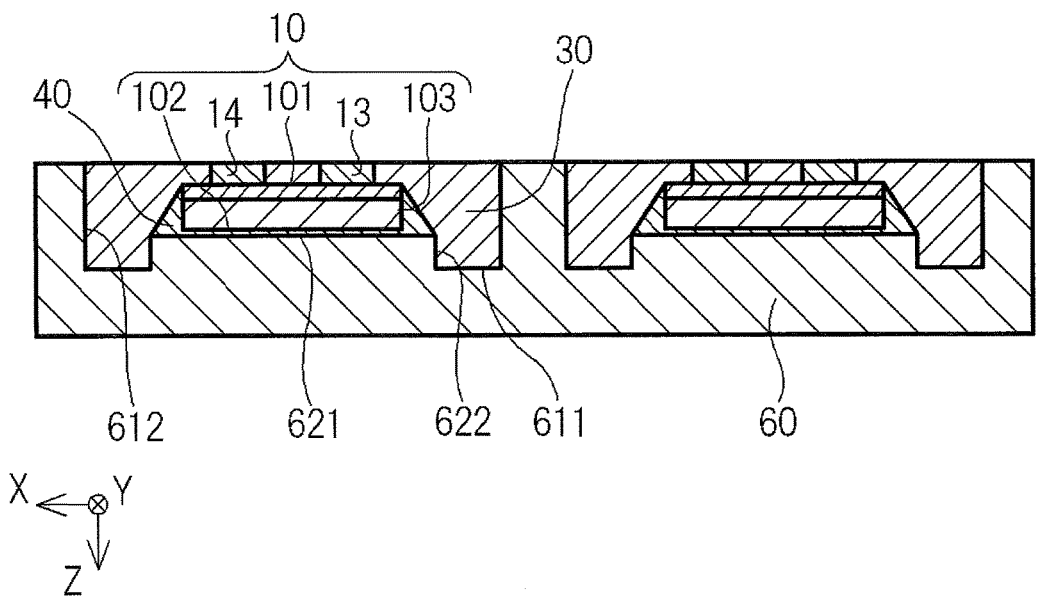
FIG. 5B is a schematic end view showing a variant example of the step of forming the first covering member according to the first embodiment.

As shown in FIG. 5B, in the case where the upper surface 621 of each of the projections 62 of the mold 60 and respective one of the light emitting elements 10 are fixed to each other by respective one of the second light-transmissive members 40, respective one of the first covering members 30 may cover the lateral surfaces 103 of the respective one of the light emitting elements 10 while being in contact with respective one of the second light-transmissive members 40. Further, in the case where each of the second light-transmissive members 40 covers the lateral surfaces 103 of respective one of the light emitting elements 10, respective one of the first covering members 30 may cover the lateral surfaces 103 of the respective one of the light emitting elements 10 via respective one of the second light-transmissive members 40.

In the first surface 101 of the light emitting element 10, regions where the electrodes 13, 14 are not formed may also be covered with the first covering member 30. At this time, the thickness (i.e., the dimension in Z-direction) of the first covering member 30 may be adjusted such that a portion of each of the electrodes 13, 14 are partially exposed outside the first covering member 30. Further, after the first covering member 30 having a thickness enough to embed the electrodes 13, 14 is foamed, a portion of the first covering member 30 may be removed so as to expose the electrodes 13, 14. The first covering member 30 may be removed using any appropriate method known in the art. Examples of such methods include etching, cutting, grinding, polishing, blasting and the like.

The first covering members 30, each of which is formed in a respective one of the plurality of first recesses, are preferably spaced apart from each other. In the case where the plurality of first covering members is continuous to each other, the first covering members need to undergo cutting or the like to be singulated into the light emitting devices. Accordingly, misalignment in cutting portions may result in variations in the shape of the light emitting devices. With the first covering members, each of which is formed in a respective one of the plurality of first recesses, being spaced apart from each other, each first covering member is formed in a state of having been singulated. Thus, variation in the shape of the first covering members can be reduced. Further, with the first covering members being spaced apart from each other, the step of cutting the portion where the plurality of first covering members is connected to each other in order to singulate the light emitting devices is not required. Accordingly, the light emitting devices are manufactured with ease.

Step 1-5. Bonding First Covering Members to Sheet

Figure 6:
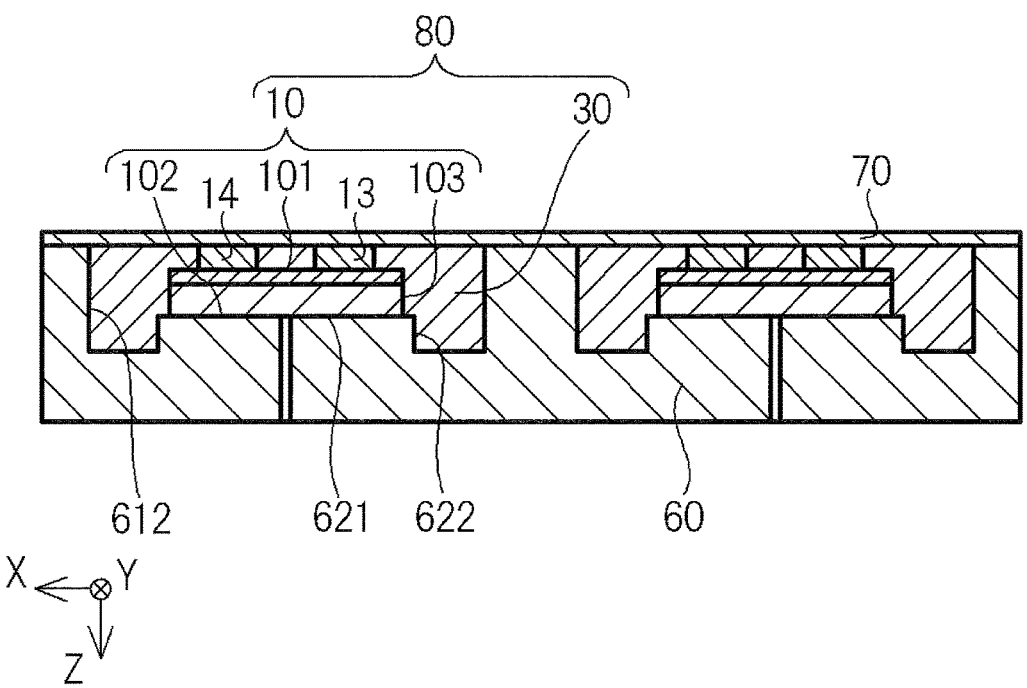
FIG. 6 is a schematic end view showing a step of bonding the first covering member to a sheet according to the first embodiment.

As shown in FIG. 6, the method may include bonding a plurality of first covering members 30 to a sheet 70. Further, the plurality of light emitting elements 10 may be bonded to the sheet 70. With light emitting device intermediate bodies 80 being connected to the sheet 70, the mold can be more easily removed from the plurality of light emitting device intermediate bodies, which will be described below, compared with the case where the light emitting device intermediate bodies are individually taken out from the mold. The "light emitting device intermediate body 80" includes the light emitting element 10 and the first covering member 30, and refers to a molding article in a state before the first light-transmissive member, which will be described below, is formed. In the case where the second light-transmissive member 40 that covers the lateral surfaces of the light emitting element 10 is disposed, the light emitting device intermediate body 80 includes the light emitting element 10, the first covering member 30, and the second light-transmissive member 40.

The sheet 70 preferably has a size that is large enough to singly cover the entire upper surface of one mold.

The sheet 70 is preferably an elastic sheet that can be deformed in accordance with to the shape of the light emitting device intermediate body 80. For example, a sheet made of silicone, polyvinyl chloride, polyolefin, polyurethane, polyimide or the like may be used for the sheet 70. The sheet 70 may have any appropriate thickness, but the thickness is preferably smaller than the height of the light emitting element 10. The thickness of the sheet is preferably in a range of about 0.02 mm to 0.3 mm. Further, the upper surface of the sheet facing the first covering member and/or the electrodes of the light emitting element has adhesiveness.

Step 1-6. Forming Second Recess

Figure 7A:
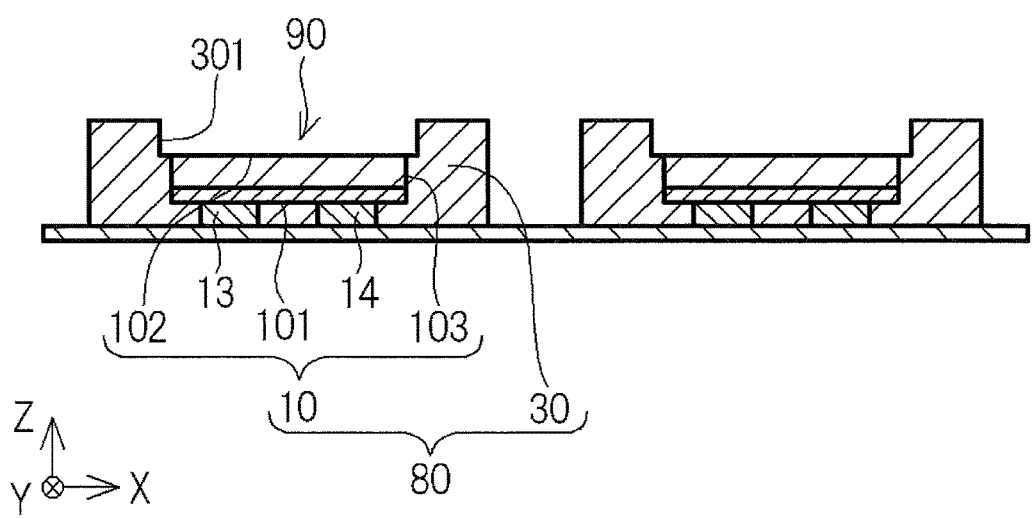
FIG. 7A is a schematic end view showing a step of forming a second recess according to the first embodiment.

As shown in FIG. 7A, by removing the mold, the second recesses 90 each defined by lateral walls 301, which are a portion of a respective one of the first covering members 30 that had been covering the lateral surfaces of a respective one of the projections, is formed. FIG. 7A shows the light emitting device intermediate body 80 taken out from the mold in a state of being turned upside-down. A portion of the bottom surface of each of the second recesses 90 is the second surface 102 of a respective one of the light emitting elements 10, and the lateral walls 301 defining each of the second recesses 90 is a portion of a respective one of the first covering members 30. In the case where the upper surface of each of the projections of the mold has an area greater than that of the second surface of a respective one of the light emitting elements, the bottom surface of each of the second recesses 90 includes the second surface of a respective one of the light emitting elements 10 and a portion of a respective one of the first covering members 30 surrounding the second surface of the respective one of the light emitting elements 10. In the case where the upper surface of each of the projections of the mold has an area smaller than the second surface of a respective one of the light emitting elements, the bottom surface of a respective one of the second recesses is constituted by the second surface of the light emitting element.

Figure 7B:
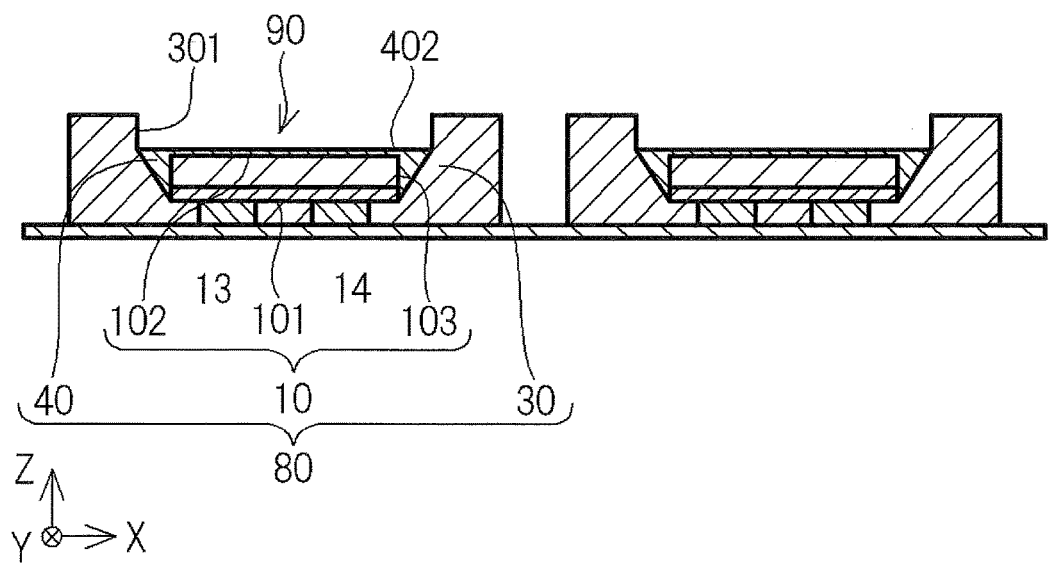
FIG. 7B is a schematic end view showing a variant example of the step of forming the second recess according to the first embodiment.

As shown in FIG. 7B, in the case where each of the light emitting device intermediate bodies 80 includes the second light-transmissive member 40, the bottom surface of a respective one of the second recesses 90 may be constituted by the upper surface 402 of a respective one of the second light-transmissive member. The upper surface 402 of the second light-transmissive member refers to the surface of the second light-transmissive member opposite to the surface facing the light emitting element. Further, the bottom surface of the second recess may be constituted by the upper surface of the second light-transmissive member and the second surface of the light emitting element.

Step 1-7. Forming First Light-Transmissive Member

Figure 8:
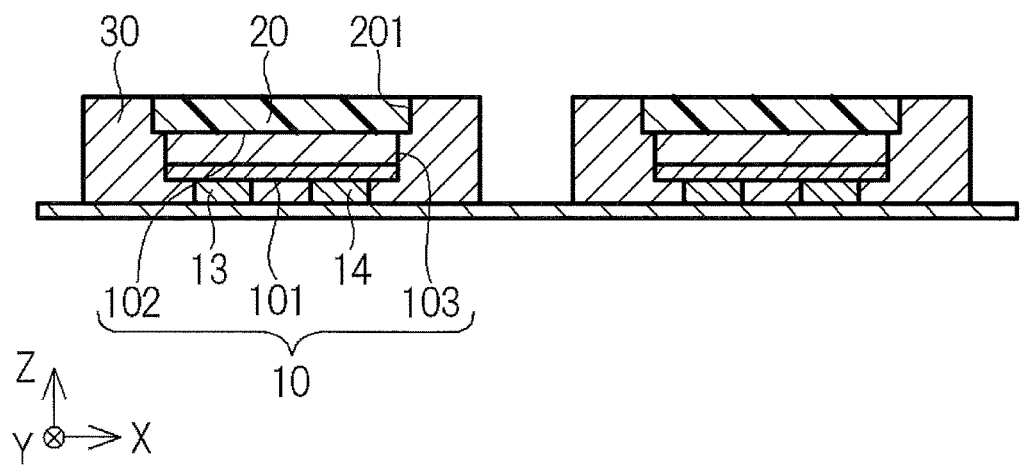
FIG. 8 is a schematic end view showing a step of forming a first light-transmissive member according to the first embodiment.

As shown in FIG. 8, each of the first light-transmissive members 20 is disposed in a respective one the second recesses 90. The lateral surfaces 201 of each of the first light-transmissive members 20 are covered with a respective one of the light-reflective first covering members 30. This structure allows for improving visibility of the light emitting device. Further, in a top view, each of the first light-transmissive members 20 is preferably surrounded by a respective one of the first covering members 30. This allows for further improving visibility of the light emitting device. The first light-transmissive member 20 can be disposed by using a potting technique, spraying, printing, or the like. In particular, a potting technique is preferable. For example, in the example shown in FIG. 8, each of the first light-transmissive members 20 is disposed to reach the height of the upper edge of a respective one of the first covering member 30. In the present embodiment, the lateral walls defining the second recess 90 is a portion of the above-described first covering member 30, which allows the first light-transmissive member 20 before being cured to be poured into the second recess 90, and thereafter, the first light-transmissive member 20 is cured.

Thus, the lateral surface of the first light-transmissive member 20 is covered with the first covering member. A conventional method of manufacturing a light emitting device includes providing a singulated and cured first light-transmissive member, and forming a first covering member that covers the lateral surfaces of the singulated and cured first light-transmissive member.

On the other hand, in the present embodiment, a step of providing a singulated and cured first light-transmissive member can be eliminated, and accordingly the light emitting device can be manufactured with ease.

The first light-transmissive member 20 is made of a light-transmissive material. Further, the first light-transmissive member 20 may contain a light-transmissive material and a wavelength conversion member. In preparing the light-transmissive material, a wavelength conversion member may be contained in the light-transmissive material at a predetermined ratio. Thereafter, the second recess 90 is filled with the light-transmissive material. With the first light-transmissive member 20 that contains the wavelength conversion member and is disposed in the second recess, a light emitting device can emit light of mixed color attributed to the combination of the light emitting element and the wavelength conversion member.

In the first light-transmissive member, the wavelength conversion member is preferably predominantly disposed on the side facing the light emitting element. With such a structure, in the case where a wavelength conversion member susceptible to moisture is employed, a portion of the first light-transmissive member at a side in which the wavelength conversion member is less densely contained functions as a protective layer. This allows for preventing deterioration of the wavelength conversion member and maintaining good chromaticity. Examples of a fluorescent material susceptible to moisture includes a KSF-based fluorescent material.

Through the steps described above, the light emitting device 100 according to the first embodiment can be obtained.

Second Embodiment

FIGS. 9A to 9D show a light emitting device 200 according to a second embodiment. The light emitting device 200 according to the present embodiment is different from the light emitting device 100 according to the first embodiment in that lateral surfaces 103 of a light emitting element 10 and a first light-transmissive member 20 faces each other. Other configurations are the same with that in the light emitting device 100 according to the first embodiment. With the light emitting device 200, light can be extracted mainly in the direction toward the lateral surfaces 103 of the light emitting element. The lateral surfaces 103 of the light emitting element includes a lateral surface of the light-transmissive substrate 11 and a lateral surface of the semiconductor layered body 12. Note that, as in the variant example of the first embodiment, the light emitting device 200 may include a second light-transmissive member that covers lateral surfaces of the light emitting element. The second light-transmissive member may cover a portion of the first surface and/or the second surface of the light emitting element.

Figure 9A:
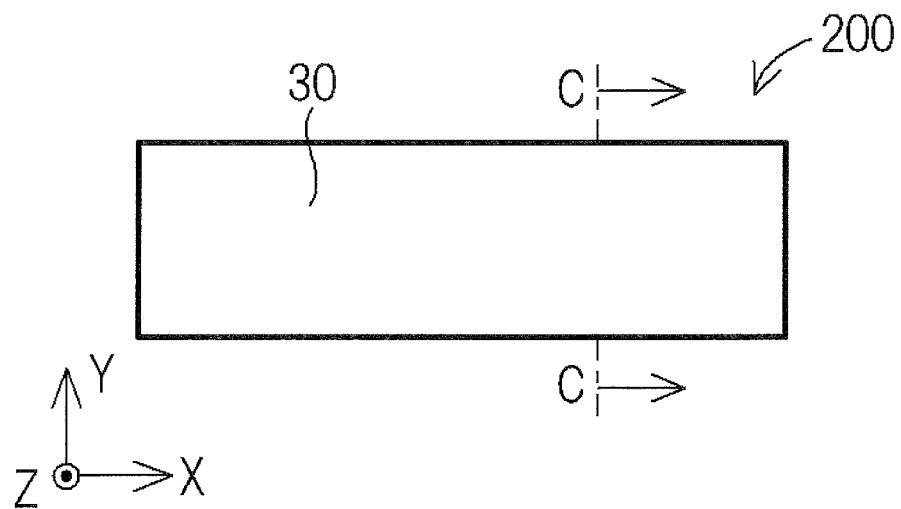
FIG. 9A is a schematic top view showing a light emitting device according to a second embodiment.
Figure 9B:
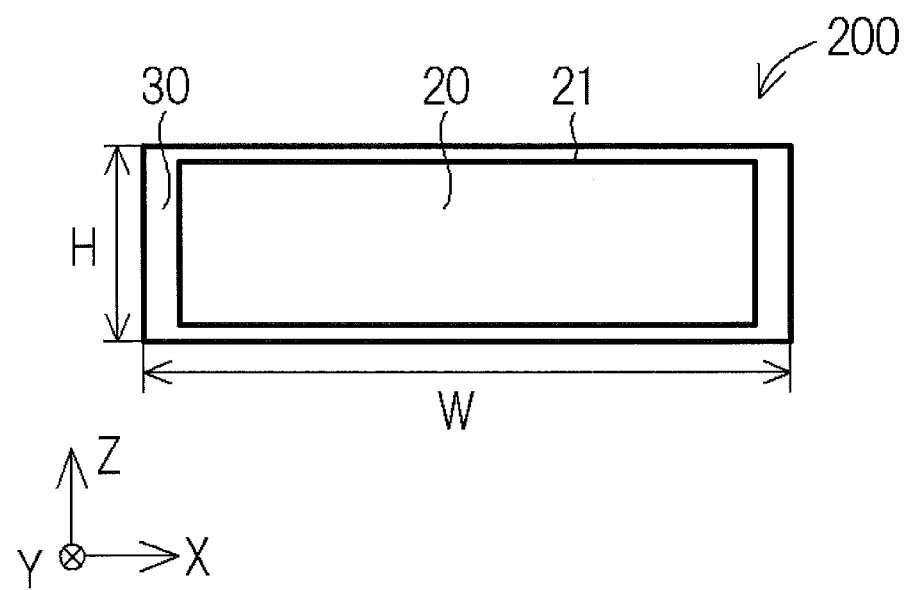
FIG. 9B is a schematic front view showing the light emitting device according to the second embodiment.
Figure 9C:
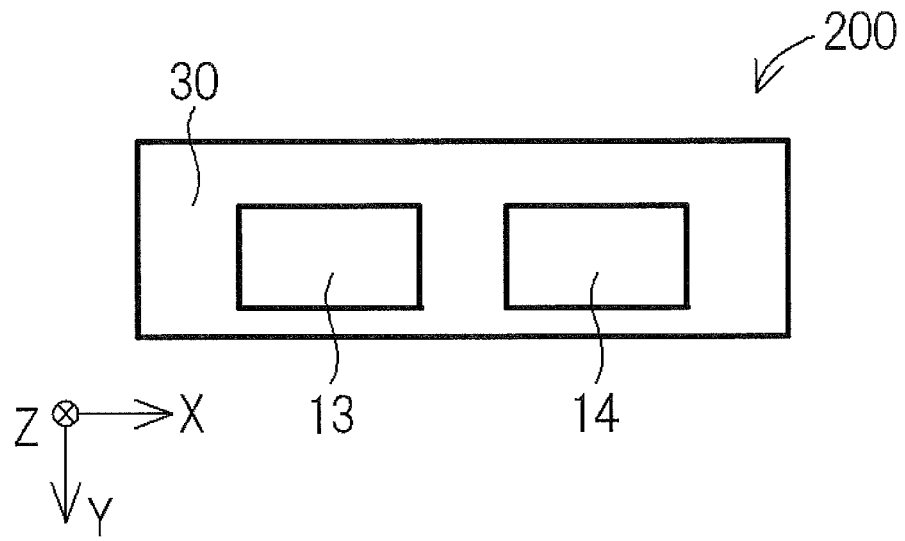
FIG. 9C is a schematic bottom view showing the light emitting device according to the second embodiment.
Figure 9D:
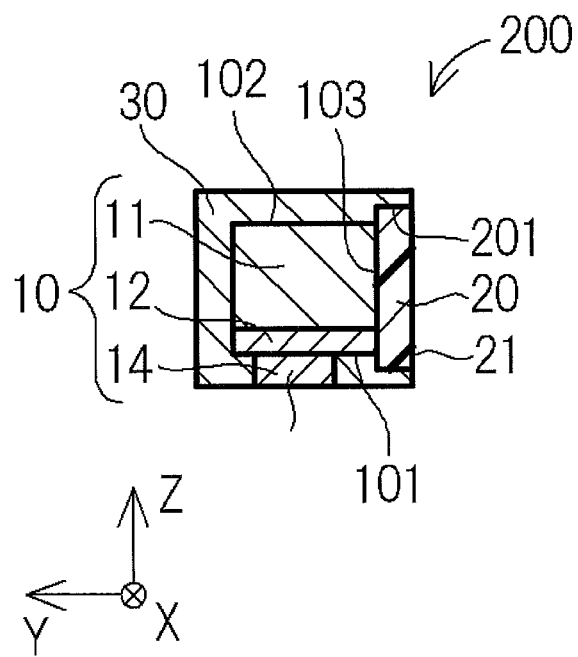
FIG. 9D is a schematic cross-sectional view taken along line C-C in FIG. 9A.

As shown in FIG. 9B, a thickness H (Z-direction) of the light emitting device 200 in a front view is preferably smaller than a width W (X-direction) of the light emitting device 200. This structure allows for obtaining a thin light emitting device.

With reference to FIGS. 10 to 14B, a description will be given of a method of manufacturing the light emitting device according to the second embodiment.

Step 2-1. Providing Light Emitting Element

A light emitting element is provided as in the method of manufacturing the light emitting device according to the first embodiment.

Step 2-2. Providing Mold

Figure 10:
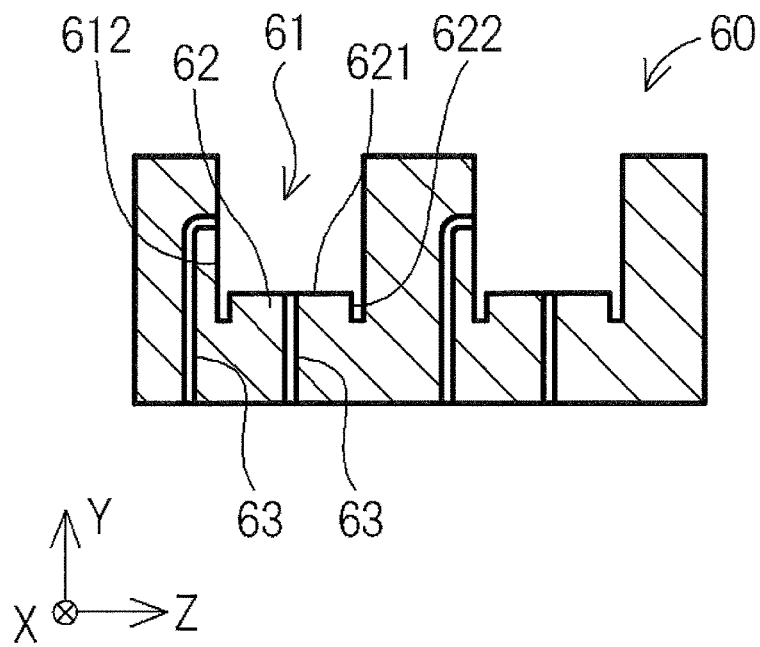
FIG. 10 is a schematic end view showing a step of providing a mold according to the second embodiment.

As shown in FIG. 10, a mold 60 is provided. One or more first recesses 61 are defined in an upper surface of the mold, and each of projections 62 is formed at a bottom surface of a respective one of the first recesses 61. A plurality of first recesses 61 is preferably provided at the upper surface. This structure allows for manufacturing a plurality of light emitting devices at once. Each of the projections 62 has an upper surface 621 for mounting the light emitting element 10. The mold has through holes 63 for vacuum suction at the upper surface 621 of each of the projections and/or the inner lateral surfaces 612 of the first recess 61. With this structure, each of the light emitting elements can be fixed to the upper surface of a respective one of the projections 62 and/or the inner lateral surface of a respective one of the first recesses 61 during mounting the light emitting elements, which will be described below.

In the present embodiment, the light emitting elements are mounted such that a lateral surface of each of the light emitting elements faces the upper surface of a respective one of the projections. Accordingly, in the case where a single light emitting element is mounted on each of the projections 62, the area of the upper surface 621 of each of the projections 62 is preferably 50% to 200%, further preferably 100% to 120%, as large as the area of a lateral surface of the light emitting element. The expression "the area of a lateral surface of the light emitting element" refers to a lateral surface of the light emitting element that faces the upper surface of a respective one of the projections.

Step 2-3. Mounting Light Emitting Element

Figure 11A:
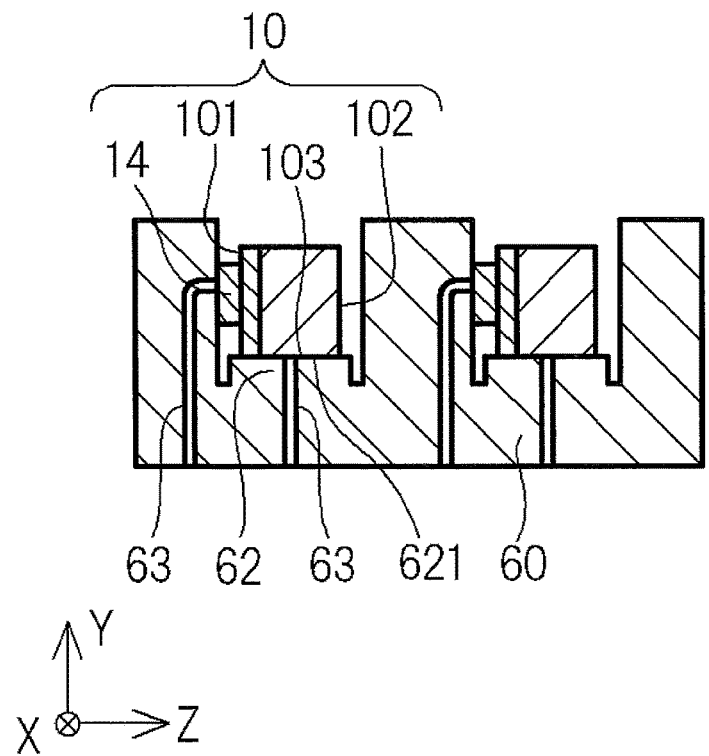
FIG. 11A is a schematic end view showing a step of mounting a light emitting element according to the second embodiment.

As shown in FIG. 11A, each of the light emitting elements 10 is mounted on the upper surface 621 of respective one of the projections 62 of the mold 60 such that the upper surface 621 of each of the projections faces one of the lateral surfaces 103 of a respective one of the light emitting elements 10. For fixing the light emitting elements 10, for example, vacuum suction may be used. In the case of performing vacuum suction, the light emitting elements are suctioned through the through holes 63 in the mold to be fixed. In the case where a lateral surface of each of the light emitting elements is fixed, a diameter of an opening of a respective one of the through holes is preferably smaller than the area of a corresponding one of the lateral surfaces of the light emitting element.

The electrodes of each of the light emitting elements are preferably arranged so as to be in contact with one of the inner lateral surfaces of a respective one of the first recesses. With this arrangement, the electrodes of each of the light emitting elements are easily exposed from a respective one of the first covering members, which will be described below. By performing vacuum suction with respect to the electrodes of each of the light emitting elements using the through hole in an inner lateral surface of a respective one of the first recesses, the light emitting elements are easily disposed such that the electrodes of each of the light emitting elements and the inner lateral surface of a respective one of the first recesses are in contact with each other. In the case where the electrodes of the light emitting element are suctioned, a diameter of an opening of each of the through holes is preferably smaller than the area of a respective one of the electrodes of the light emitting element.

Figure 11B:
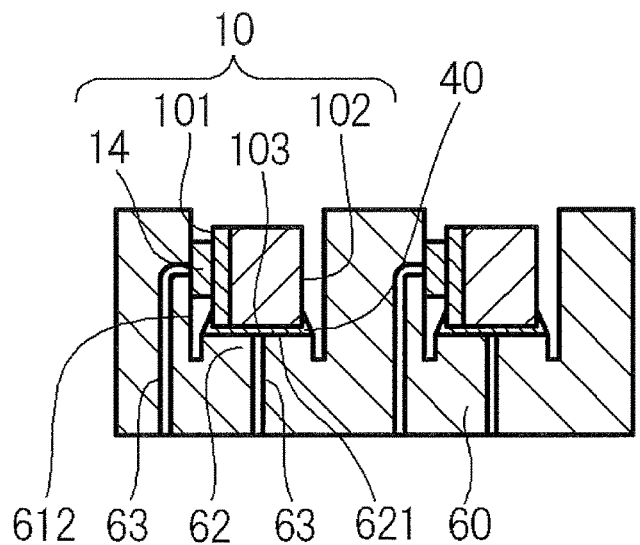
FIG. 11B is a schematic end view showing a variant example of the step of mounting the light emitting element according to the second embodiment.
Figure 11B:
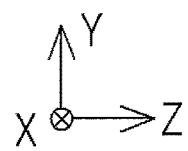

For fixing the light emitting element 10, as in the method of manufacturing the light emitting device according to the first embodiment, a second light-transmissive member 40 may be used. After the second light-transmissive member 40 in the liquid state before being cured is disposed between the upper surface of each of the projections 62 and the lateral surfaces of each of the light emitting elements 10, the second light-transmissive member is cured. Thus, as shown in FIG. 11B, each of the light emitting elements 10 is fixed by the second light-transmissive member 40 disposed between the upper surface of a respective one of the projections 62 and the lateral surfaces of each of the light emitting elements 10. The second light-transmissive member in the liquid state before being cured may be provided at the upper surface of each of the projections 62, or may be provided at the lateral surfaces of each of the light emitting elements 10.

The second light-transmissive member 40 may cover the first surface 101 of the light emitting element 10, the lateral surfaces 103 of the light emitting element, and a portion of the second surface 102 of the light emitting element 10. Further, after each of the light emitting elements is disposed on the upper surface of a respective one of the projections, the second light-transmissive members each covering the first surface of a respective one of the light emitting elements, the second surface of the respective one of the light emitting elements and/or a portion of each of the lateral surfaces of the light emitting elements may be formed.

Step 2-4. Forming First Covering Member

Figure 12:
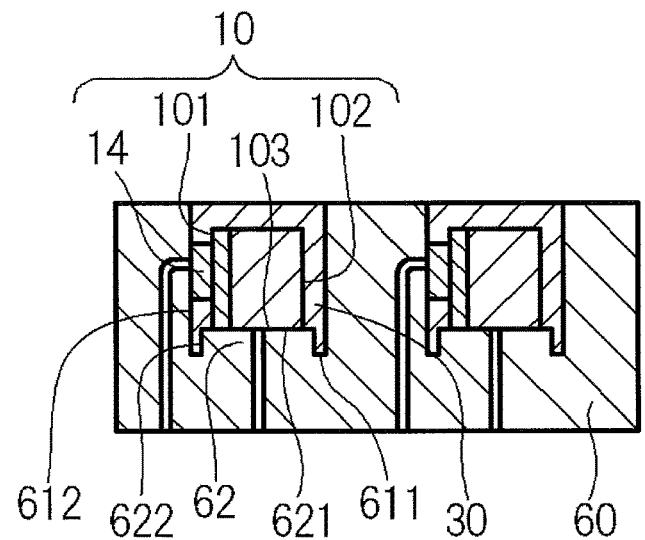
FIG. 12 is a schematic end view showing a step of fouling a first covering member according to the second embodiment.
Figure 12:
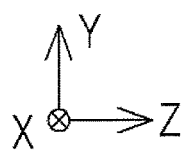

As shown in FIG. 12, in the first recesses of the mold, the first covering members 30 each covering the inner lateral surfaces 612 of a respective one of the first recesses of the mold, the lateral surfaces 622 of a respective one of the projections 62 of the mold, and the lateral surfaces 103 of a respective one of the light emitting elements 10 is formed. Each of the first covering members 30 may cover the bottom surface 611 of a respective one of the first recesses of the mold. In the method of manufacturing the light emitting device according to the present embodiment, each of the first covering members 30 covers a lateral surface of a respective one of the light emitting elements that is opposite to a lateral surface 103 thereof facing a respective one the projections of the mold. Further, the first covering member 30 also covers the first surface 101 and the second surface 102 of the light emitting element. At least a portion of each of the lateral surfaces 103 of each of the light emitting elements that faces a respective one of the projections of the mold is exposed from the first covering member.

In the case where the upper surface of each of the projections 62 of the mold and a respective one of the light emitting elements 10 are fixed to each other by a respective one of the second light-transmissive members 40, each of the first covering members 30 may cover the lateral surface of a respective one of the light emitting elements 10 so as to be in contact with a respective one of the second light-transmissive members 40. Further, in the case where the second light-transmissive member 40 covers the first surface 101 and the second surface 102 of the light emitting element 10, the first covering member 30 may cover the first surface 101 and the second surface 102 of the light emitting element 10 via the second light-transmissive member 40.

With the electrodes of each of the light emitting elements 10 being in contact with one of the inner lateral surfaces of a respective one of the first recesses 61 of the mold, a portion of each of the electrodes of each of the light emitting elements 10 can be exposed from a respective one of the first covering members 30. In the case where the electrodes of each of the light emitting elements 10 are covered with a respective one of the first covering members 30, a portion of the respective one of the first covering members 30 is removed to expose a portion of each of the electrodes of each of the light emitting elements 10 from the respective one of the first covering members 30.

Step 2-5. Bonding First Covering Members to Sheet

Figure 13:
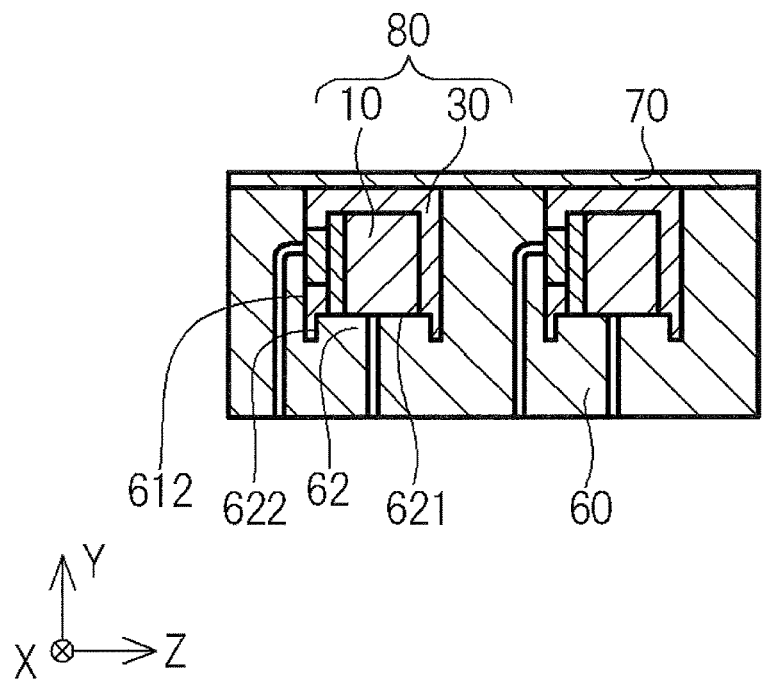
FIG. 13 is a schematic end view showing a step of bonding the first covering member to a sheet according to the second embodiment.

As shown in FIG. 13, the method may include bonding a plurality of first covering members 30 to a sheet 70. This allows for facilitating removing of the mold 60 from a plurality of light emitting device intermediate bodies 80.

Step 2-6. Forming Second Recess

Figure 14A:
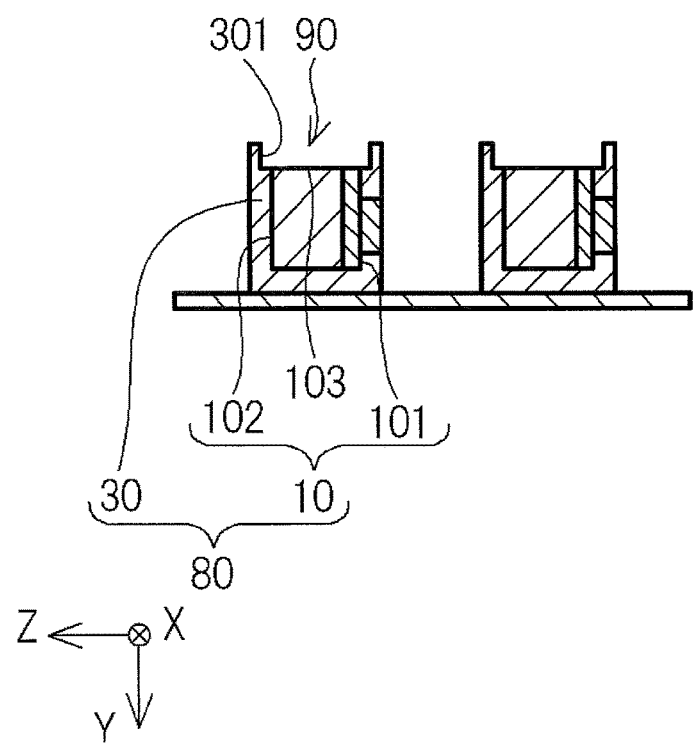
FIG. 14A is a schematic end view showing a step of foiling a second recess according to the second embodiment.

As shown in FIG. 14A, by removing the mold, the second recesses 90, each of which is defined by lateral walls 301, which are a portion of a respective one of the first covering members 30 that had been covering the lateral surfaces of a respective one of the projections 62 is formed. FIG. 14A shows the light emitting device intermediate bodies 80 taken out from the mold in a state of being turned upside-down. A portion of the bottom surface of the second recess 90 is one of the lateral surfaces 103 of the light emitting element 10, and the lateral walls 301 of the second recess 90 are a portion of the first covering member 30. In the case where the upper surface of each of the projections of the mold is has an area larger than that of a corresponding one of the lateral surfaces of a respective one of the light emitting elements 10, the bottom surface of a respective one of the second recesses 90 includes the corresponding one of the lateral surfaces of the respective one of the light emitting elements and a respective one of the first covering members 30 surrounding the corresponding one of the lateral surfaces of the respective one of the light emitting elements. In the case where the upper surface of each of the projections of the mold has an area smaller than an area of a corresponding one of the lateral surfaces of a respective one of the light emitting elements, the bottom surface of a respective one of the second recesses includes the corresponding one of the lateral surfaces of a respective one of the light emitting elements.

Figure 14B:
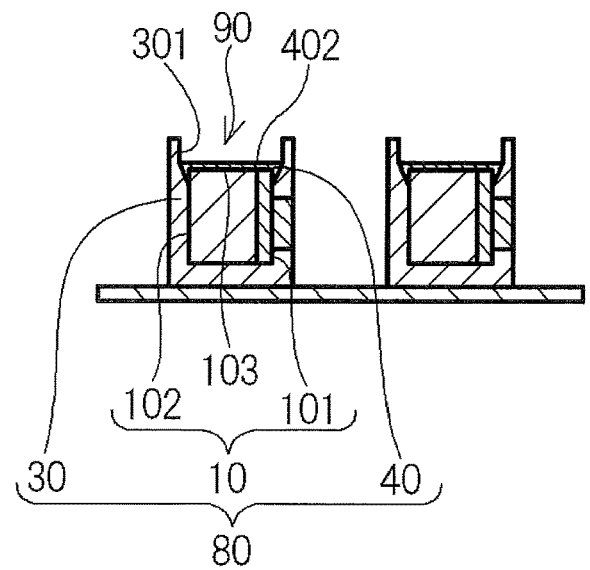
FIG. 14B is a schematic end view showing a variant example of the step of forming the second recess according to the second embodiment.

As shown in FIG. 14B, in the case where each of the light emitting device intermediate bodies 80 includes the second light-transmissive member 40, the bottom surface of each of the second recesses 90 may be constituted by the upper surface 402 of the second light-transmissive member 40. The "upper surface 402 of the second light-transmissive member 40" refers to a surface of the second light-transmissive member at a side opposite to the surface facing the light emitting element. Further, the bottom surface of the second recess 90 may be constituted by the upper surface of the second light-transmissive member 40 and a corresponding one of the lateral surfaces of the light emitting element 10.

Step 2-7. Forming First Light-Transmissive Member

The first light-transmissive member is disposed in the second recess as in the method of manufacturing the light emitting device according to the first embodiment. Thus, as in the method of manufacturing the light emitting device according to the first embodiment, the method of manufacturing the light emitting device according to the second embodiment does not require providing a singulated and cured first light-transmissive member. Accordingly, the light emitting device can be manufactured at ease.

Through the steps as described above, the light emitting device 200 according to the second embodiment can be obtained. As in the light emitting device 100 according to the first embodiment, the lateral surfaces 201 of the first light-transmissive member 20 are covered with the first covering member 30, so that the light emitting device 200 can have good visibility.

Third Embodiment

Figure 15A:
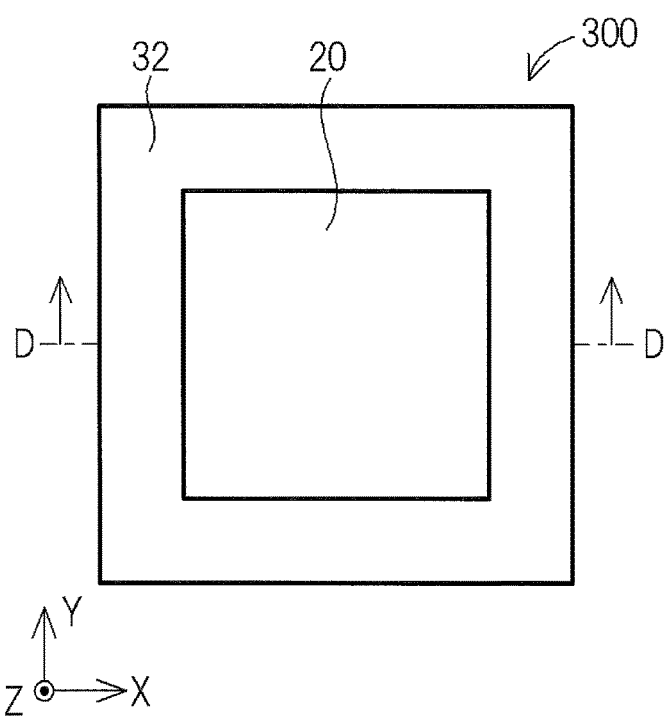
FIG. 15A is a schematic top view showing a light emitting device according to a third embodiment.
Figure 15B:
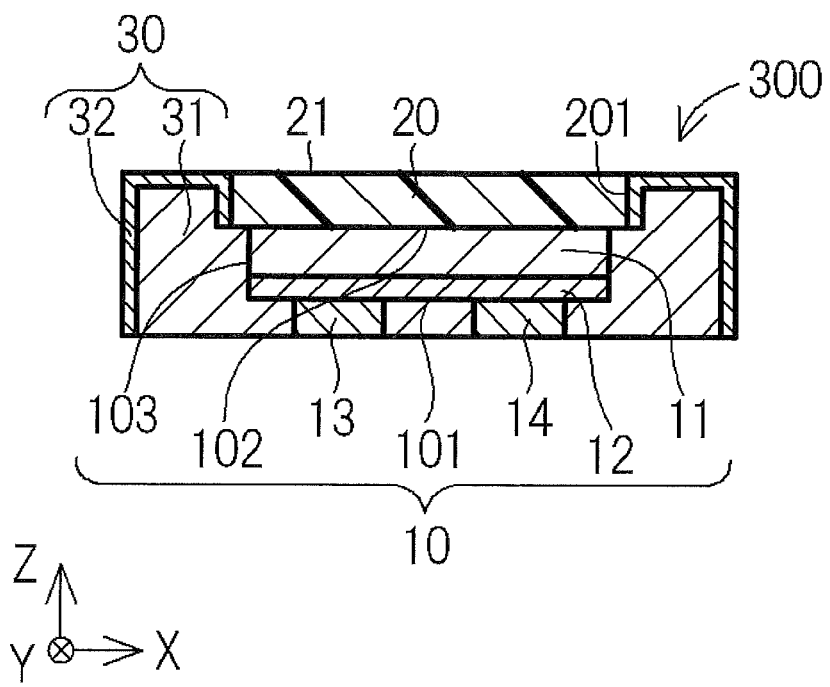
FIG. 15B is a schematic cross-sectional view taken along line D-D in FIG. 15A.

FIGS. 15A and 15B show a light emitting device 300 according to a third embodiment. The light emitting device 300 according to the third embodiment is different from the light emitting device 100 according to the first embodiment in that the first covering member 30 includes a second covering member (a first covering component) 31 and a third covering member (a second covering component) 32, and the third covering member covers the second covering member. The third covering member covers the upper surface of the second covering member. Other configurations of the light emitting device 300 is similar to that of the light emitting device 100 according to the first embodiment.

In the case where the light emitting device is used in a displaying apparatus such as a display device, the third covering member 32 is preferably a dark-color member. With the third covering member made of a dark-color member, the third covering member is less likely to reflect external light such as sunlight, illumination, or the like. Accordingly a reduction in displaying contrast attributed to reflection of external light can be reduced. Further, the second covering member 31 preferably has a reflectance at the peak wavelength of the light emitting element higher than that of the third covering member 32. With the second covering member 31 covering the lateral surfaces 103 of the light emitting element, the second covering member having a high reflectance allows for improving the light extraction efficiency of the light emitting device. Note that, as in the variant example of the method of manufacturing the light emitting device according to the first embodiment, the light emitting device 300 may include a second light-transmissive member that covers the lateral surfaces and/or the second surface of the light emitting element.

Figure 15C:
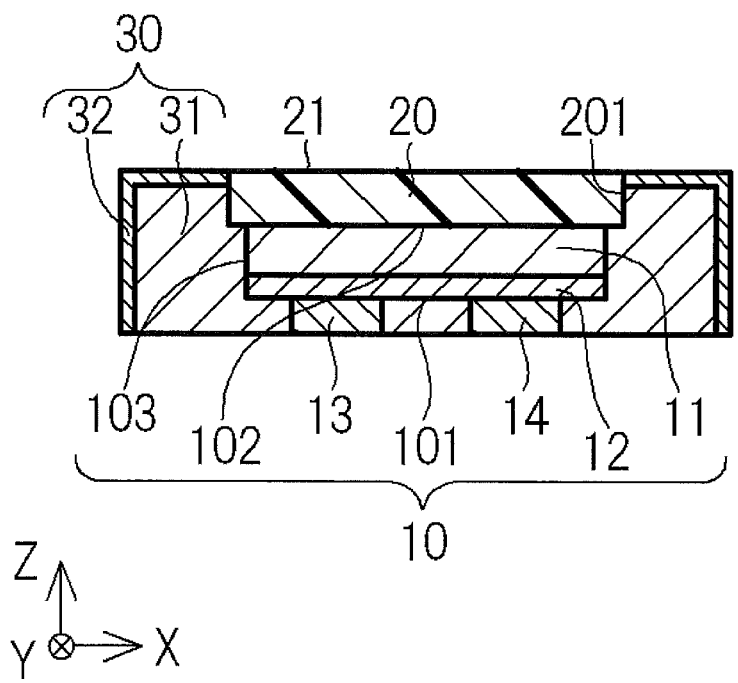
FIG. 15C is a schematic cross-sectional view showing a variant example of the light emitting device according to the third embodiment.

In the case where the third covering member is made of a dark-color member, as shown in FIG. 15C, in the lateral surface 201 of the first light-transmissive member, the area of a portion of the first light-transmissive member being in contact with the second covering member is preferably larger than the area of a portion the first light-transmissive member being in contact with the third covering member. This structure allows for reducing absorption of light from the light emitting element by the third covering member.

Figure 16:
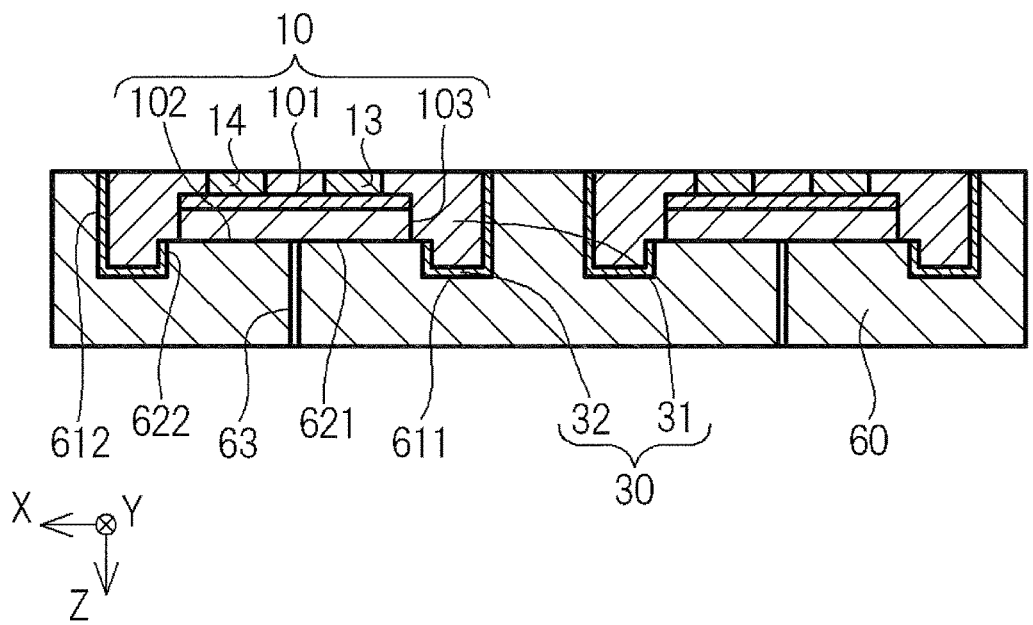
FIG. 16 is a schematic end view showing a step of forming a first covering member according to the third embodiment.

With reference to FIG. 16, a description will be given of a method of manufacturing the light emitting device according to the third embodiment.

Step 3-1. Providing Light Emitting Element

As in the method of manufacturing the light emitting device according to the first embodiment, light emitting elements are provided.

Step 3-2. Providing Mold

As in the method of manufacturing the light emitting device according to the first embodiment, a mold is provided.

Step 3-3. Mounting Light Emitting Element

As in the method of manufacturing the light emitting device according to the first embodiment, each of the light emitting elements is mounted on the upper surface of a respective one of projections of the mold.

Step 3-4. Forming First Covering Member

As shown in FIG. 16, in first recesses of the mold, each of the first covering members 30 is formed to cover the inner lateral surfaces 612 of a respective one of the first recesses of the mold, the lateral surfaces 622 of a respective one of the projections of the mold, and the lateral surfaces 103 of a respective one of the light emitting elements. Each of the first covering members 30 includes a respective one of the second covering members 31 and a respective one of the third covering members 32. Further, each of the second covering members 31 covers a respective one of the third covering members 32.

In each of the first recesses of the mold, the third covering member 32 is formed to cover the inner lateral surfaces 612 of a respective one of the first recesses of the mold and the lateral surfaces 622 of a respective one of the projections of the mold. Each of the third covering members 32 covers at least the bottom surface 611 of a respective one of the first recesses of the mold. Thus, the third covering member that surrounds the light emitting surface of the light emitting device in a plan view can be formed. Further, each of the third covering members 32 may cover the inner lateral surfaces 612 of a respective one of the first recesses and/or the lateral surfaces 622 of a respective one of the projections. For example, at the time of forming the third covering members, a mask that covers a portion of each of the first recesses where a respective one of the third covering members is not to be formed is used. With the third covering members 32 each covering the inner lateral surfaces of a respective one of the first recesses and/or the lateral surfaces of a respective one of the projections, necessity of using the mask that covers the inner lateral surfaces of the respective one of the first recesses and/or the lateral surfaces of the respective ones of the projections can be eliminated. In this manner, formation of the third covering member can be facilitated.

After the third covering members are formed, in each of the first recesses of the mold, each of the second covering members 31 covering the lateral surfaces 103 of a respective one of the light emitting elements and is covered with a respective one of the third covering member is formed. As described above, in the case where just the lower mold is used, the forming of the second covering members and the third covering members can be performed by using a potting technique, printing, spraying or the like. When the lower mold and the upper mold are used, the forming of the second covering members and the third covering members can be performed by transfer molding, compression molding, injection molding, or the like. In particular, the forming of the third covering members is preferably performed by using a sputtering technique. By employing a sputtering technique for the forming of the third covering member, the third covering member having a uniform thickness can be formed at ease. Further, with a sputtering technique, the thickness of the third covering member can be controlled at ease. In the case where the third covering member is made of a member of a dark color, light from the light emitting element is easily absorbed by the third covering member compared with the case where the third covering member is a white member. Controlling the thickness of the third covering member can reduce absorption of light from the light emitting element by the third covering member.

Each of the third covering members may be formed before a respective one of the light emitting elements is mounted on the upper surface of a respective one of the projections, or after the respective one of the light emitting elements is mounted on the upper surface of the respective one of the projections. In the case where each of the third covering members is formed before a respective one of the light emitting elements is mounted on the upper surface of a respective one of the projection, masks each covering the upper surface of the respective one of the projections is used. In this manner, each of the third covering members can be prevented from being formed on the upper surface of a respective one of the projections. Preventing each of the third covering members from being formed on the upper surface of a respective one of the projections, each of the third covering members is less easily disposed between a respective one of the light emitting elements and the light emitting surface. Thus, even in the case where the third covering member is made of a dark-color member, light from the light emitting element is less easily absorbed by the third covering member. After the third covering members are formed, each of the light emitting elements is mounted on the upper surface of a respective one of the projections of the mold. After the light emitting elements are mounted, the second covering members are formed.

In the case where the third covering members are formed after each of the light emitting elements is mounted on the upper surface of a respective one of the projections, masks each covering a respective one of the light emitting elements is preferably used. Use of the masks allows for preventing contact between each of the light emitting elements and a respective one of the third covering members. Thus, even in the case where the third covering member is made of a dark-color member, absorption of light from the light emitting element by the third covering member can be reduced. After the third covering members are formed, the second covering members are formed.

Step 3-5. Bonding First Covering Member to Sheet

As in the method of manufacturing the light emitting device according to the first embodiment, the method may include bonding the first covering members to a sheet. Further, a plurality of light emitting elements may be bonded to a sheet. This allows for facilitating removing the mold from a plurality of light emitting device intermediate bodies.

Step 3-6. Forming Second Recess

As in the method of manufacturing the light emitting device according to the first embodiment, the mold is removed, so that the second recesses, each of which is defined by lateral walls, which are a portion of a respective one of the first covering members which had been covering the lateral surfaces of a respective one of the projections is formed.

Step 3-7. Forming First Light-Transmissive Member

As in the method of manufacturing the light emitting device according to the first embodiment, each of the first light-transmissive members is disposed in a respective one of the second recesses. Thus, as in the method of manufacturing the light emitting device according to the first embodiment, the method of manufacturing the light emitting device according to the present embodiment does not require providing a singulated and cured first light-transmissive members. Accordingly, the light emitting device can be manufactured at ease.

Through the steps as described above, the light emitting device 300 according to the third embodiment is obtained. As in the light emitting device 100 according to the first embodiment, with the lateral surfaces 201 of the first light-transmissive member 20 being covered with the first covering member 30, the light emitting device 300 has good visibility.

Fourth Embodiment

Figure 17:
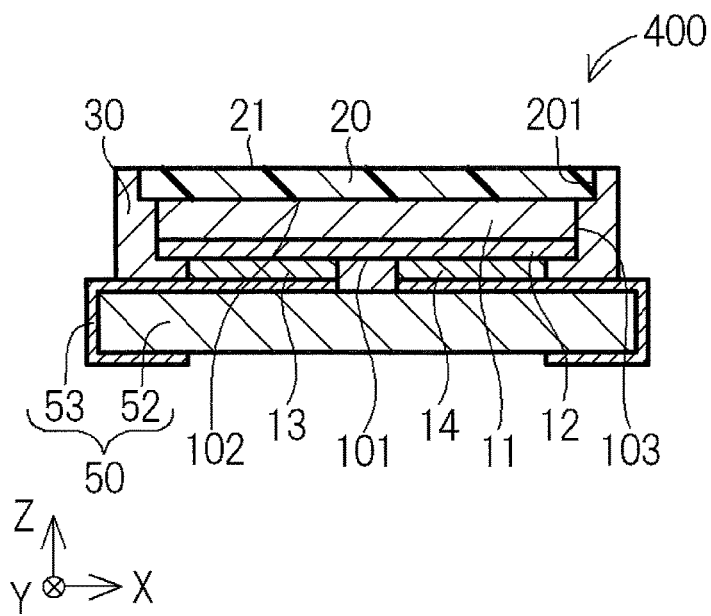
FIG. 17 is a schematic cross-sectional view showing a light emitting device according to a fourth embodiment.

FIG. 17 shows a light emitting device 400 according to a fourth embodiment. The light emitting device 400 according to the present embodiment is different from the light emitting device 100 according to the first embodiment in that the light emitting element 10 is mounted on a supporting substrate 50. Other configurations of the light emitting device 400 is similar to that in the light emitting device 100 according to the first embodiment. The supporting substrate 50 includes an insulating base member 52 and conductive wirings 53. The light emitting element 10 is mounted on the supporting substrate 50, so that the light emitting element 10 can be supplied with electric power via the supporting substrate 50. As in the variant example of the first embodiment, the light emitting device 400 may include a second light-transmissive member that covers the lateral surfaces and/or the second surface of the light emitting element 10.

With reference to FIGS. 18 to 22, a description will be given of a method of manufacturing the light emitting device according to the fourth embodiment.

Step 4-1. Providing Light Emitting Element

Figure 18:
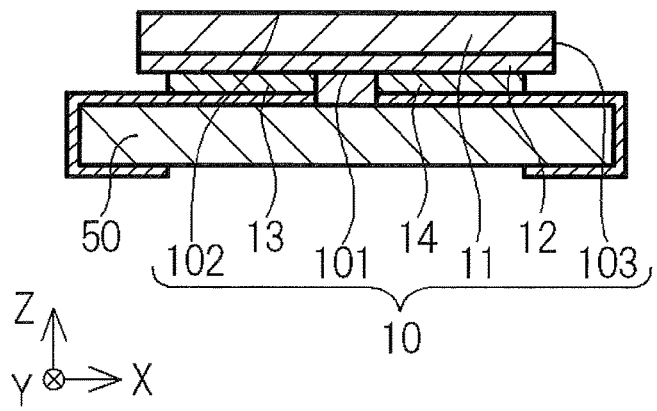
FIG. 18 is a schematic end view showing a step of providing the light emitting element according to the fourth embodiment.
Figure 19:
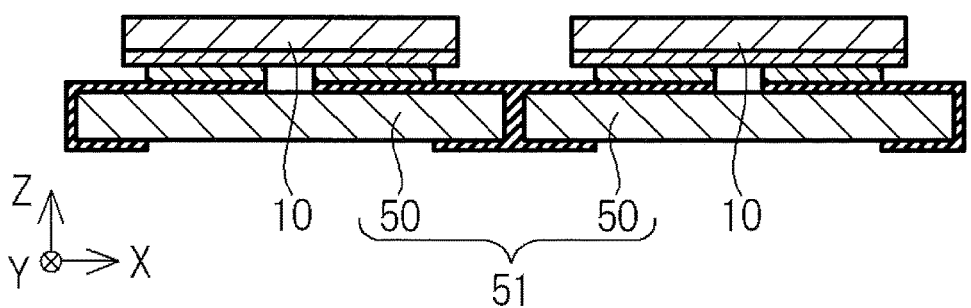
FIG. 19 is a schematic end view showing a variant example of the step of providing the light emitting element according to the fourth embodiment.

Light emitting elements 10 as in the method of manufacturing the light emitting device according to the first embodiment are provided. As shown in FIG. 18, the light emitting element 10 according to the present embodiment is mounted on the supporting substrate 50. Further, as shown in FIG. 19, the plurality of light emitting elements 10 may be mounted on a collective substrate 51, in which a plurality of supporting substrates 50 are connected together.

Step 4-2. Providing Mold

As in the method of manufacturing the light emitting device according to the first embodiment, a mold is provided.

Step 4-3. Mounting Light Emitting Element

Figure 20:
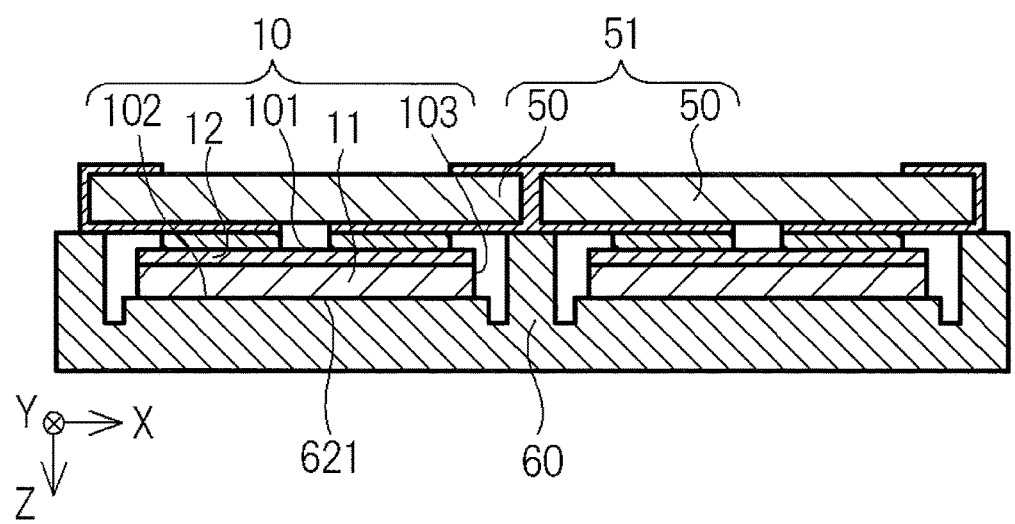
FIG. 20 is a schematic end view showing a step of mounting the light emitting element according to the fourth embodiment.

As shown in FIG. 20, each of the light emitting elements 10 is mounted on the upper surface of a respective one the projections of the mold. As in the method of manufacturing the light emitting device according to the first embodiment, the light emitting elements 10 may be fixed using vacuum suction. A portion of each of the supporting substrates may be located in a respective one of the first recesses. In the case where a plurality of light emitting elements 10 is mounted on the collective substrate 51, in which a plurality of supporting substrates 50 is connected together, a portion of the collective substrate 51 is positioned outside corresponding ones of the first recesses.

For fixing of the light emitting elements 10, as in the method of manufacturing the light emitting device according to the first embodiment, second light-transmissive members may be used. Thus, each of the light emitting elements is fixed by a respective one of the second light-transmissive members disposed between the upper surface of a respective one of the projections and the second surface of each light emitting element.

Step 4-4. Forming First Covering Member

Figure 21:
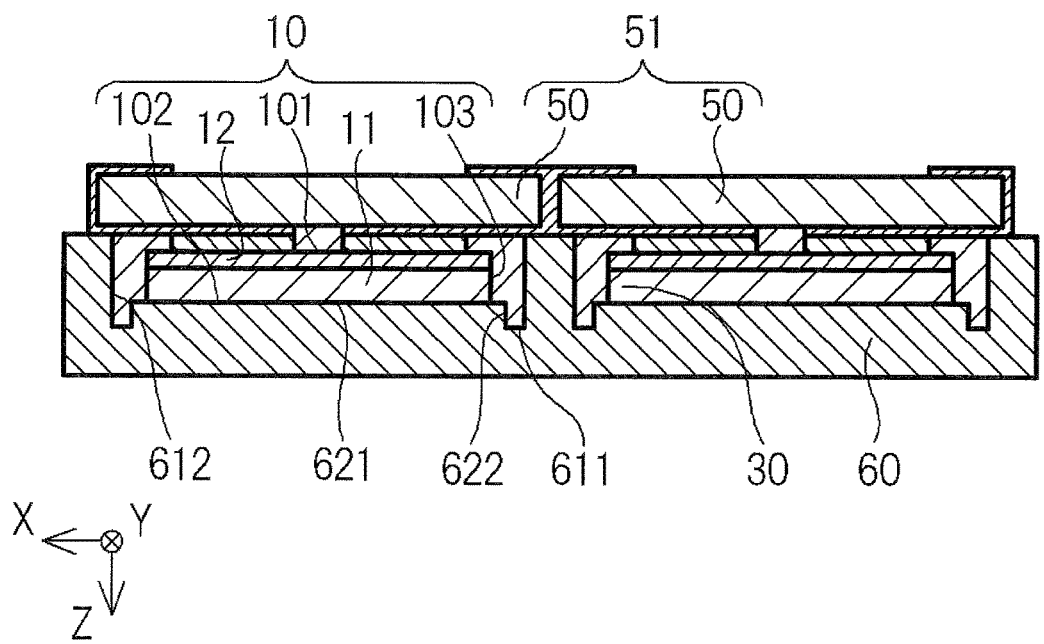
FIG. 21 is a schematic end view showing a step of forming a first covering member according to the fourth embodiment.

As shown in FIG. 21, in the first recesses of the mold, the first covering members 30 are formed each covering the inner lateral surfaces 612 of a respective one of the first recesses of the mold, the lateral surfaces 622 of a respective one of the projections of the mold, and the lateral surfaces 103 of a respective one of the light emitting elements. At this time, third covering members 32 may be disposed, each of which covering the bottom surface 611 of a respective one of the first recesses of the mold. Each of the first covering members 30 may cover a portion of a surface of a respective one of the supporting substrates that faces the mold.

Step 4-5. Forming Second Recess

As in the method of manufacturing the light emitting device according to the first embodiment, the mold is removed, so that the second recesses, each of which is defined by lateral walls, which are a portion of a respective one of the first covering members which had been covering the lateral surfaces of a respective one of the projections is formed.

Step 4-6. Forming First Light-Transmissive Member

As in the method of manufacturing the light emitting device according to the first embodiment, each of the first light-transmissive members is disposed in a respective one of the second recesses. Thus, as in the method of manufacturing the light emitting device according to the first embodiment, the method of manufacturing the light emitting device according to the present embodiment does not require providing singulated and cured first light-transmissive members. Accordingly, the light emitting device is manufactured with ease.

Step 4-7. Singulating Collective Substrate

Figure 22:
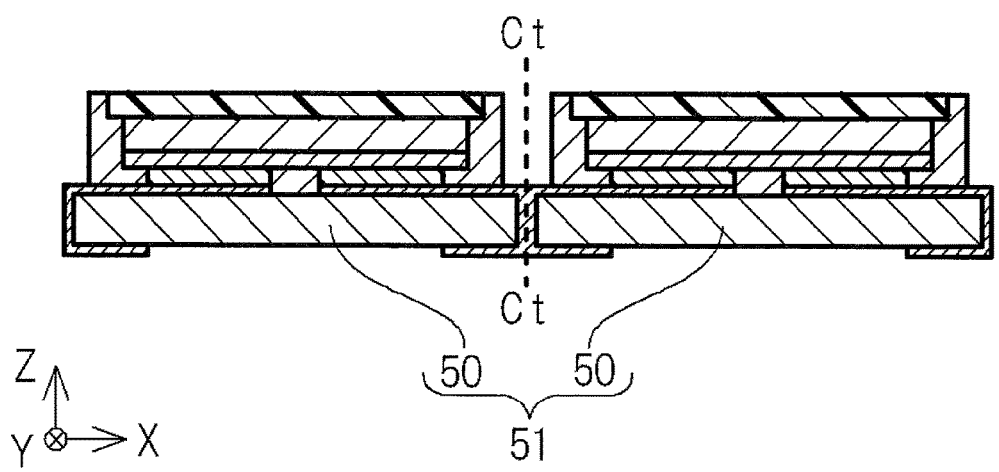
FIG. 22 is a schematic end view showing a step of singulating a collective substrate assembly according to the fourth embodiment.

In the case of using the collective substrate 51 in which a plurality of supporting substrates 50 is connected, as shown in FIG. 22, the supporting substrates 50 may be singulated by cutting a portion corresponding to line Ct-Ct (indicated by a broken line). That is, the singulating may be performed by, for example, cutting connecting portions between the plurality of supporting substrates 50.

Through the steps as described above, the light emitting device 400 according to the fourth embodiment is obtained. As in the light emitting device 100 according to the first embodiment, the lateral surfaces 201 of the first light-transmissive member 20 is covered with the first covering member 30, so that the light emitting device 400 has good visibility.

In the description below, materials suitable for constituent members of the light emitting devices according to the embodiments will be illustrated.

Light Emitting Element

For the light emitting element, for example, a semiconductor light emitting element such as a light emitting diode may be used. The light emission wavelength of the light emitting element may be selected from the ultraviolet light range or may be selected from the visible light range (380 nm to 780 nm). The light emitting element may include a light-transmissive substrate, a semiconductor layered body, and electrodes.

Semiconductor Layered Body

The semiconductor layered body includes a plurality of semiconductor layers. An exemplary semiconductor layered body may include three semiconductor layers, namely, a first conductivity type semiconductor layer (e.g., an n-type semiconductor layer), a light emitting layer (i.e., an active layer), and a second conductivity type semiconductor layer (e.g., a p-type semiconductor layer). For a semiconductor layer that can emit ultraviolet light or visible light in a range of blue to green light, for example, a semiconductor material such as a Group III-V compound semiconductor, a Group II-VI compound semiconductor or the like. More specifically, a nitride-based semiconductor material such as $In_XAl_YGa_{1-X-Y}N$ ($0 \leq X$, $0 \leq Y$, $X+Y \leq 1$) (e.g., InN, AlN, GaN, InGaN, AlGaN, InGaAlN or the like) may be used for such a semiconductor layer. For the semiconductor layered body that can emit red light, GaAs, GaAlAs, GaP, InGaAs, InGaAsP or the like may be used.

Light-Transmissive Substrate

For the light-transmissive substrate of the light emitting element, a light-transmissive insulating material such as sapphire ($Al_2O_3$), or a semiconductor material that transmits light from the semiconductor layered body (e.g., a nitride-based semiconductor material) can be used. The light-transmissive substrate is configured to transmit about 60%, 65%, 70%, 80% or greater of light emitted from the light emitting element.

Electrodes

A plurality of electrodes of the light emitting element is disposed on a same surface side of the semiconductor layer. The plurality of electrodes may have a single-layer structure or a layered structure, so long as each of the electrodes is ohmic-connected to a respective one of the first conductivity type semiconductor layer and the second conductivity type semiconductor layer such that current-voltage characteristic has a linear or substantially linear shape. Such electrodes can have any appropriate thickness, can be made of any appropriate material known in the art, and can have any appropriate structure known in the art. For example, the electrodes preferably has a thickness in a range of 10 μm to 300 μm. Further, the electrodes may be made of an electrically conductive material, and metal such as Cu, Au, Ag, or AuSn is preferably used for the electrodes.

First Light-Transmissive Member

The first light-transmissive member transmits light from the light emitting element, and constitutes the light emitting surface of the light emitting device. For the first light-transmissive member, a light-transmissive resin, glass or the like may be used. In particular, a light-transmissive resin is preferably used. For such a light-transmissive resin, a thermosetting resin such as a silicone resin, a silicone modified resin, an epoxy resin, or a phenolic resin, or a thermoplastic resin such as a polycarbonate resin, an acrylic resin, a methylpentene resin, or a polynorbornene resin may be employed. In particular, a silicone resin, which has good light resistance and heat resistance, can be preferably used.

The first light-transmissive member may contain, in addition to the above-described material, particles of a fluorescent material as a wavelength conversion member. For the fluorescent material, a fluorescent material that can be excited by light emitted from the light emitting element can be used. Examples of a fluorescent material that can be excited by a blue-color light emitting element or an ultraviolet light emitting element include: a cerium-activated yttrium-aluminum-garnet-based fluorescent material (Ce:YAG); a cerium-activated lutetium-aluminum-garnet-based fluorescent material (Ce:LAG); an europium and/or chromium-activated nitrogen-containing calcium aluminosilicate-based fluorescent material ($CaO-Al_2O_3-SiO_2$); an europium-activated silicate-based fluorescent material (($Sr,Ba)_2SiO_4$); a nitride-based fluorescent material such as a β sialon fluorescent material, a CASN-based fluorescent material, a SCASN-based fluorescent material; a KSF-based fluorescent material ($K_2SiF_6$:Mn); a sulfide-based fluorescent material, and a quantum dot fluorescent material. Combination of such a fluorescent material and a blue-color light emitting element or an ultraviolet light emitting element allows for manufacturing a light emitting device configured to emit light of various colors (e.g., a light emitting device configured to emit white light). Further, the first light-transmissive member may contain various types of filler for adjusting viscosity or the like.

Second Light-Transmissive Member

The second light-transmissive member covers the lateral surfaces of the light emitting element and/or the second surface of the light emitting element. Examples of a material of the second light-transmissive member include a light-transmissive resin and glass. In particular, a light-transmissive resin is preferable.

For such a light-transmissive resin, a thermosetting resin such as a silicone resin, a silicone modified resin, an epoxy resin, or a phenolic resin, or a thermoplastic resin such as a polycarbonate resin, an acrylic resin, a methylpentene resin, or a polynorbornene resin may be employed. In particular, a silicone resin, which has good light resistance and heat resistance, is preferable. With the second light-transmissive member in contact with a surface of the light emitting element, the second light-transmissive member is susceptible to heat that is generated at the light emitting element when the light emitting element is turned on. Because a thermosetting resin has good heat resistance, a thermosetting resin is suitable for the second light-transmissive member.

The second light-transmissive member preferably has a high light-transmittance. Accordingly, normally, it is preferable that no additive that reflects, absorbs, or scatters light is added to the second light-transmissive member. However, in some cases, in order to obtain a desired characteristic, it is preferable to add some additive to the second light-transmissive member. For example, filler of various kinds may be added to the second light-transmissive member in order to adjust the refractive index of the second light-transmissive member, or to adjust the viscosity of the second light-transmissive member in a state before being cured.

First Covering Member

The first covering member reflects light from the light emitting element, and is made of a light reflective material. The first covering member is disposed to cover the lateral surfaces of the first light-transmissive member. Further, the first covering member also covers the lateral surface of the light emitting element. In the case where the light emitting device includes a second light-transmissive member, the first covering member is disposed to cover the second light-transmissive member.

The first covering member is made of a material which allows for satisfying a predetermined relationship between a thermal expansion coefficient of the first light-transmissive member, a thermal expansion coefficient of the second light-transmissive member, and a thermal expansion coefficient of the light emitting element. That is, the material of the first covering member is selected so that the difference $\Delta T_{40}$ between the thermal expansion coefficient of the first covering member and the thermal expansion coefficient of the light emitting element is smaller than the difference $\Delta T_{30}$ between the thermal expansion coefficient the first light-transmissive member and the thermal expansion coefficient of the light emitting element. For example, in the case where the light emitting element includes a light-transmissive substrate made of sapphire, and a semiconductor layered body made of a GaN-based semiconductor, the thermal expansion coefficient of the light emitting element is in a range of about $5\times10^{-6}$/K to $7\times10^{-6}$/K. Meanwhile, in the case where the first light-transmissive member or the second light-transmissive member is made of a silicone resin, the thermal expansion coefficient of the first light-transmissive member is in a range of $2\times10^{-5}$/K to $3\times10^{-5}$/K. Accordingly, with the first covering member made of a material having a thermal expansion coefficient smaller in than that of the silicone resin, $\Delta T_{40} < \Delta T_{30}$ is satisfied.

In the case where a resin material is used for the first covering member, the thermal expansion coefficient of the first covering member is generally on the order of $10^{-5}$/K, which is one digit greater than the thermal expansion coefficient of a general light emitting element. However, by adding filler or the like to the resin material, the thermal expansion coefficient of the first covering member can be reduced. For example, by adding filler such as silica to the silicone resin, the thermal expansion coefficient can be reduced compared with the silicone resin in a state before adding the filler.

For the resin material that can be used for the first covering member, in particular, a thermosetting light-transmissive resin, such as a silicone resin, a silicone modified resin, an epoxy resin, or a phenolic resin is preferably used.

The first covering member may be made of a light-reflective resin. The "light-reflective resin" refers to a resin material having a reflectance of 70% or greater with respect to light emitted from the light emitting element. Light having reached the first covering member is reflected toward the light emitting surface of the light emitting device, which allows for increasing light extraction efficiency of the light emitting device.

Examples of the light-reflective resin include a light-transmissive resin in which a light-reflective substance is dispersed. For the light-reflective substance, for example, titanium oxide, silicon oxide, zirconium oxide, potassium titanate, aluminum oxide, aluminum nitride, boron nitride, mullite or the like can be suitably used. The light-reflective substance may have a granular shape, a fibrous shape, a flaky shape, or the like. In particular, the light-reflective substance having a fibrous shape is expected to have effect of reducing the thermal expansion coefficient of the first covering member, and thus is preferable.

The first covering member may include a second covering member and a third covering member. Each of the second covering member and the third covering member may be made of a material similar to the above-described materials of the first covering member. The third covering member may be a dark-color member. The dark-color member may be formed by, for example, allowing the resin material to contain a dark-color pigment. The dark-color pigment may be an inorganic pigment of which a main component is carbon black. The inorganic pigment has durability against deterioration due to light greater than that of an organic pigment such as dye. Accordingly, the inorganic pigment can greatly reduce discoloration due to deterioration.

Supporting Substrate

The supporting substrate is a substrate on which the light emitting element is mounted. In the supporting substrate, wirings are disposed on an insulating base member. Examples of a material of the base member include alumina, alumina nitride, glass epoxy resin or the like. Examples of a material of the wirings include a conductive material such as gold, silver, or copper.

Certain embodiments according to the present disclosure have been exemplarily described above. The present invention is not limited to the embodiments described above, and may be appropriately modified without departing from the scope of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, comprising:
   providing a mold with a mold recess having a bottom and an inner peripheral surface that defines the mold recess and that is connected to the bottom, the bottom including a bottom projection and a bottom recess surrounding the bottom projection to define the bottom projection that has a projection top surface and a projection peripheral surface opposing the inner peripheral surface, the projection top surface defining a part of the bottom;
   mounting a light emitting element on the bottom projection in the mold recess such that a light extraction surface of the light emitting element faces the projection top surface and such that an outer peripheral surface of the light emitting element opposes the inner peripheral surface of the mold recess;
   providing a covering material in the mold recess to cover the inner peripheral surface of the mold recess, the outer peripheral surface of the light emitting element, and the projection peripheral surface;
   removing the mold to provide a recess in the covering material; and
   providing a light-transmissive material in the recess in the covering material.

2. The method according to claim 1,
   wherein the light emitting element has a first surface on which electrodes are disposed, a second surface opposite to the first surface, and a light emitting element lateral surface connecting the first surface and the second surface, and
   wherein the light extraction surface is the second surface.

3. The method according to claim 1,
   wherein the light emitting element has a first surface on which electrodes are disposed, a second surface opposite to the first surface, and a light emitting element lateral surface connecting the first surface and the second surface, and
   wherein the light extraction surface is the light emitting element lateral surface.

4. The method according to claim 2, wherein the light emitting element is mounted on the bottom projection via an additional light-transmissive material.

5. The method according to claim 4, wherein the additional light-transmissive material covers the light emitting element lateral surface.

6. The method according to claim 1, further comprising:
   providing the mold further having an additional mold recess having an additional bottom and an additional inner peripheral surface that defines the additional mold recess and that is connected to the additional bottom, the additional bottom including an additional bottom projection and an additional bottom recess surrounding the additional bottom projection to define the additional bottom projection that has an additional projection top surface and an additional projection peripheral surface opposing the additional inner peripheral surface, the additional projection top surface defining a part of the additional bottom;
   mounting a first additional light emitting element on the additional bottom projection in the additional mold recess such that a first additional light extraction surface of the first additional light emitting element faces the additional projection top surface and such that a first additional outer peripheral surface of the first additional light emitting element opposes the additional inner peripheral surface of the additional mold recess;
   providing the covering material in the additional mold recess to cover the additional inner peripheral surface of the additional mold recess, the first additional outer peripheral surface of the first additional light emitting element, and the additional projection peripheral surface;
   removing the mold to provide an additional recess in the covering material; and
   providing the light-transmissive material in the additional recess.

7. The method according to claim 6, wherein the covering material provided in the mold recess is spaced apart from the covering material provided in the additional mold recess.

8. The method according to claim 7, further comprising:
   bonding a sheet to the covering material provided in the mold recess and the covering material provided in the additional mold recess after the covering material is provided in the mold recess and the additional mold recess.

9. The method according to claim 1,
   wherein the covering material includes a first covering component and a second covering component, and
   wherein the second covering component covers the first covering component.

10. The method according to claim 9, wherein the first covering component has a reflectance with respect to a peak wavelength of the light emitting element greater than a reflectance of the second covering component with respect to the peak wavelength of the light emitting element.

11. The method according to claim 1, further comprising:
    mounting a second additional light emitting element on the bottom projection in the mold recess such that a second additional light extraction surface of the second additional light extraction surface faces the bottom projection.

12. The method according to claim 1, wherein the mold has at least one through hole for suctioning the light emitting element.

13. The method according to claim 1, wherein the light-transmissive material includes a wavelength conversion material.

14. The method according to claim 13, wherein, in each of the light-transmissive material, the wavelength conversion material is predominantly disposed adjacent to a surface of the light-transmissive material, the surface facing the light extraction surface of the light emitting element.

15. The method according to claim 1, further comprising:
   mounting the light emitting element on a supporting substrate before the light emitting element is mounted on the bottom projection in the mold recess.

16. The method according to claim 1, wherein the covering material is provided to cover an entirety of the projection peripheral surface.

17. The method according to claim 1, wherein the covering material is provided to cover an entirety of the inner peripheral surface of the mold recess.

18. The method according to claim 1, wherein the covering material is provided to cover a surface of the light emitting element, the surface being opposite to the light extraction surface.

* * * * *